United States Patent
Song

(10) Patent No.: US 10,417,162 B2
(45) Date of Patent: Sep. 17, 2019

(54) MEMORY PACKAGE INCLUDING BUFFER, EXPANSION MEMORY MODULE, AND MULTI-MODULE MEMORY SYSTEM

(71) Applicant: Samsung Electronics Co., Ltd., Suwon-si (KR)

(72) Inventor: Won-hyung Song, Osan-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 292 days.

(21) Appl. No.: 15/339,236

(22) Filed: Oct. 31, 2016

(65) Prior Publication Data

US 2017/0161223 A1    Jun. 8, 2017

(30) Foreign Application Priority Data

Dec. 4, 2015 (KR) .................. 10-2015-0172661

(51) Int. Cl.
| | |
|---|---|
| G06F 13/40 | (2006.01) |
| G06F 1/18 | (2006.01) |
| G06F 3/06 | (2006.01) |
| G06F 13/16 | (2006.01) |
| H01L 23/00 | (2006.01) |

(52) U.S. Cl.
CPC .......... *G06F 13/4068* (2013.01); *G06F 1/185* (2013.01); *G06F 3/0626* (2013.01); *G06F 3/0656* (2013.01); *G06F 3/0683* (2013.01); *G06F 13/1673* (2013.01); *H01L 24/17* (2013.01); *H01L 24/29* (2013.01); *H01L 24/48* (2013.01); *H01L 24/49* (2013.01); *H01L 24/73* (2013.01); *H01L 2224/16235* (2013.01); *H01L 2224/17181* (2013.01); *H01L 2224/32225* (2013.01); *H01L 2224/48091* (2013.01); *H01L 2224/48106* (2013.01); *H01L 2224/48227* (2013.01); *H01L 2224/73207* (2013.01); *H01L 2224/73253* (2013.01); *H01L 2224/73265* (2013.01); *H01L 2924/00014* (2013.01); *H01L 2924/1434* (2013.01)

(58) Field of Classification Search
None
See application file for complete search history.

(56) References Cited

U.S. PATENT DOCUMENTS

| | | | |
|---|---|---|---|
| 7,429,788 | B2 | 9/2008 | Clayton et al. |
| 7,442,050 | B1 | 10/2008 | Bhakta et al. |
| 7,480,152 | B2 | 1/2009 | Goodwin |
| 7,633,767 | B2 | 12/2009 | Lee |

(Continued)

*Primary Examiner* — Elias Mamo
(74) *Attorney, Agent, or Firm* — Muir Patent Law, PLLC

(57) ABSTRACT

Provided are a memory package, an expansion memory module, and a multi-module memory system. A base memory module, to/from which an expansion memory module is capable of being attached/detached, includes a module board, a plurality of module terminals arranged on the module board to be connected to a slot, and a plurality of memory packages, each of which including a first surface to be attached to the module board and a second surface opposite to the first surface facing away from the module board, wherein each of the plurality of memory packages includes a plurality of package terminals exposed on the second surface of the memory package to be connected to the expansion memory module.

20 Claims, 20 Drawing Sheets

(56) References Cited

U.S. PATENT DOCUMENTS

| | | | |
|---|---|---|---|
| 7,753,688 B1 | 7/2010 | Everson et al. | |
| 7,839,645 B2 | 11/2010 | Pauley et al. | |
| 8,151,009 B2* | 4/2012 | Goldstein | G06F 13/4286 710/11 |
| 8,248,805 B2 | 8/2012 | Brandon et al. | |
| 8,334,704 B2 | 12/2012 | Lin et al. | |
| 8,379,391 B2 | 2/2013 | Amidi et al. | |
| 9,007,783 B2 | 4/2015 | Bolanowski et al. | |
| 2007/0126125 A1* | 6/2007 | Rapport | G11C 5/04 257/777 |
| 2008/0225476 A1 | 9/2008 | Karabatsos | |
| 2008/0270649 A1* | 10/2008 | Pearson | G06F 13/409 710/100 |
| 2009/0209134 A1 | 8/2009 | Park et al. | |
| 2009/0304389 A1 | 12/2009 | Joe et al. | |
| 2013/0054949 A1* | 2/2013 | Berke | G11C 5/14 713/2 |
| 2013/0083473 A1* | 4/2013 | Mahran | H05K 7/1431 361/679.32 |
| 2014/0368988 A1 | 12/2014 | Tobias | |
| 2018/0143777 A1* | 5/2018 | Dasu | G06F 3/061 |

\* cited by examiner

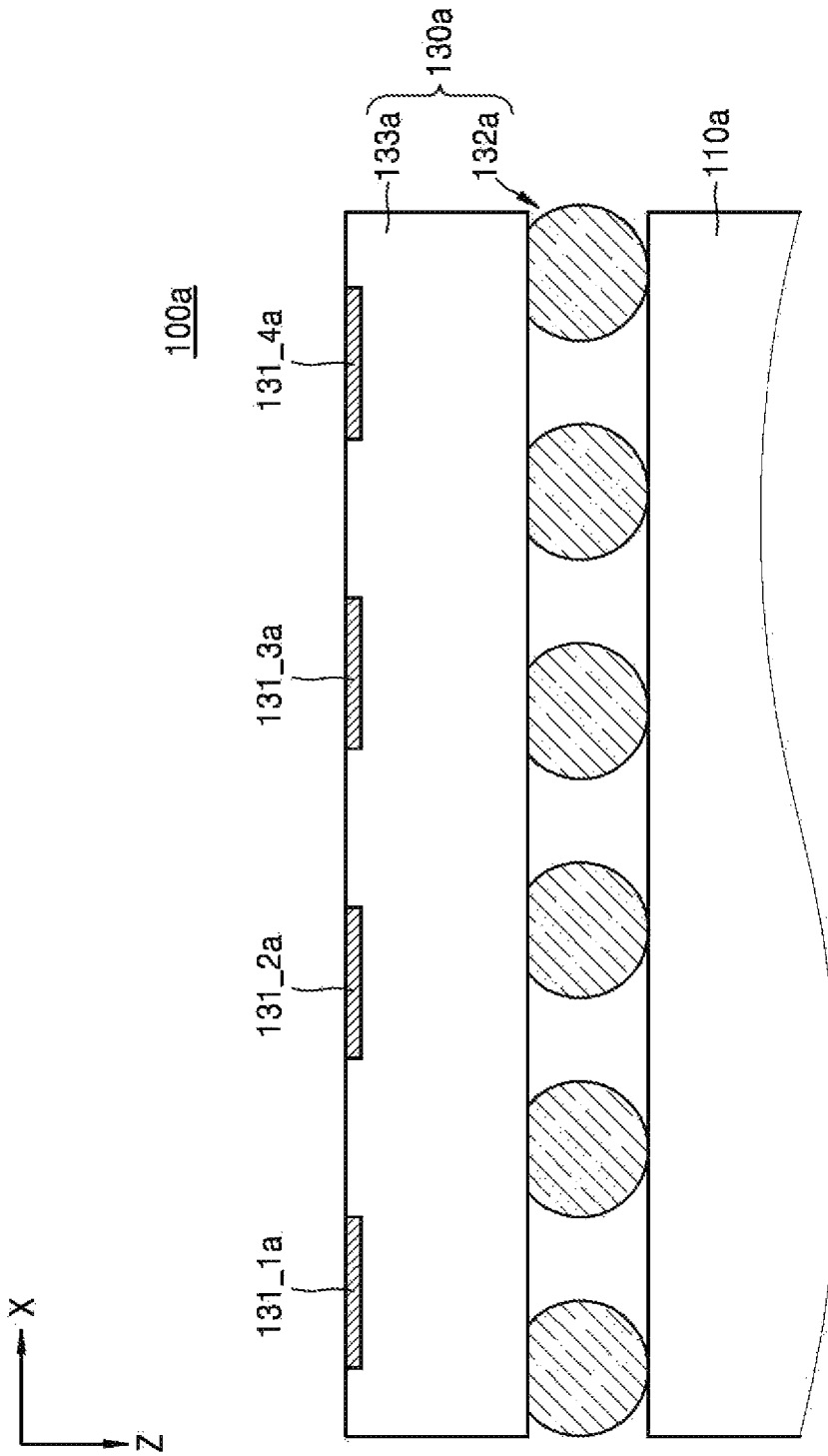

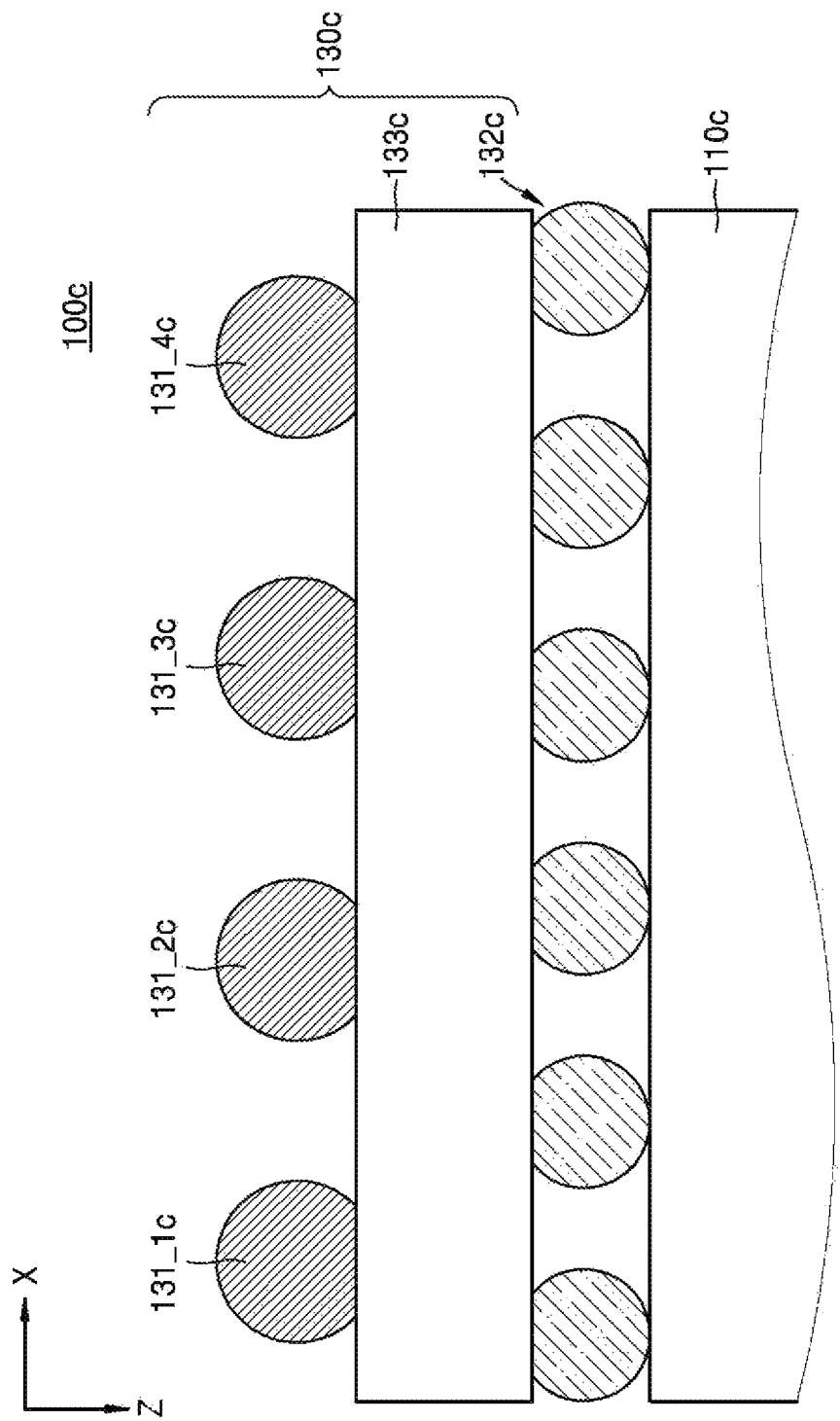

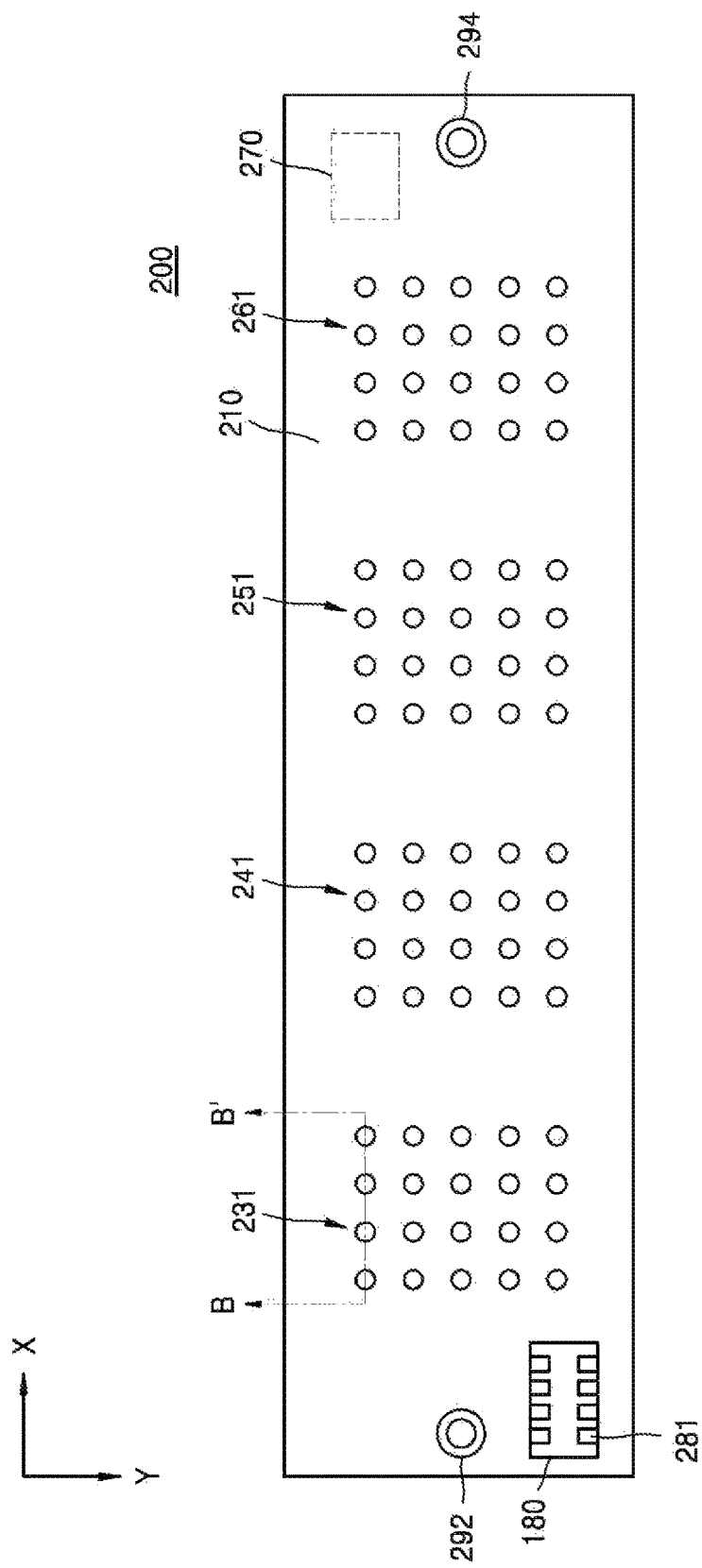

MEMORY PACKAGE INCLUDING BUFFER, EXPANSION MEMORY MODULE, AND MULTI-MODULE MEMORY SYSTEM

CROSS-REFERENCE TO RELATED APPLICATION

This application claims the benefit of priority under 35 USC § 119 to Korean Patent Application No. 10-2015-0172661, filed on Dec. 4, 2015, in the Korean Intellectual Property Office, the disclosure of which is incorporated herein in its entirety by reference.

BACKGROUND

The example embodiments relate to a memory package, a memory module, and a memory system, and more particularly, to a memory package including a buffer, an expansion memory module, and a multi-module memory system.

A memory module may include one or more semiconductor memory packages and a module board having attached thereto the semiconductor memory packages. The memory module may be attached to a computing system and may communicate with a memory controller of the computing system. The computing system may have a slot to which other memory modules may be connected, such that a user may add or remove memory modules as the occasion demands. A high-performance computing system often requires a memory module having a large storage capacity and high operation speed. However, having multiple memory modules takes up space. Therefore, it would be beneficial to reduce the amount of space used by memory modules of a computing system.

SUMMARY

The example embodiments provide a memory package, a memory module, and a memory system having a high speed and expandability.

According to an aspect of the inventive concept, there is provided a base memory module, to which an expansion memory module is attachable/detachable, the base memory module including a module board; a plurality of module terminals, which are arranged on the module board to be connected to a slot; and a plurality of memory packages, each of which includes a first surface to be attached to the module board and a second surface opposite to the first surface facing away from the module board, wherein each of the plurality of memory packages includes a plurality of package terminals exposed on the second surface of the memory package to be connected to the expansion memory module.

According to another aspect of the inventive concept, there is provided an expansion memory module, which may be attached to and detached from a base memory module attached to a slot, the expansion memory module including a module board, which includes a first surface that faces the base memory module when the expansion memory module is attached to the base memory module and a second surface opposite to the first surface facing away from the base memory module; a plurality of expansion memory packages attached onto the second surface of the module board; and a plurality of conductive connecting elements, which are arranged on the first surface of the module board to be connected to a plurality of terminals arranged on a base memory package of the base memory module, wherein each of the expansion memory packages is electrically connected to at least one of the plurality of conductive connecting elements.

According to another aspect of the inventive concept, there is provided an electronic which includes: an expandable base module board; a plurality of base module terminals arranged on the expandable base module board for connecting to a slot of a system board; and a plurality of base memory packages, each of which includes a first surface facing the expandable base module board and a second surface opposite to the first surface facing away from the expandable base module board, wherein each of the plurality of base memory packages comprises a plurality of base package terminals exposed on the second surface of the base memory package configured to be connected to an expansion memory module.

BRIEF DESCRIPTION OF THE DRAWINGS

Embodiments of the inventive concept will be more clearly understood from the following detailed description taken in conjunction with the accompanying drawings in which:

FIGS. 5A through 5C are diagrams showing example cross-sections of the base memory module taken along a line A-A of FIG. 4, according to example embodiments;

FIG. 8 is a plan view of the expansion memory module according to an exemplary embodiment;

DETAILED DESCRIPTION OF THE EMBODIMENTS

Figure 1:
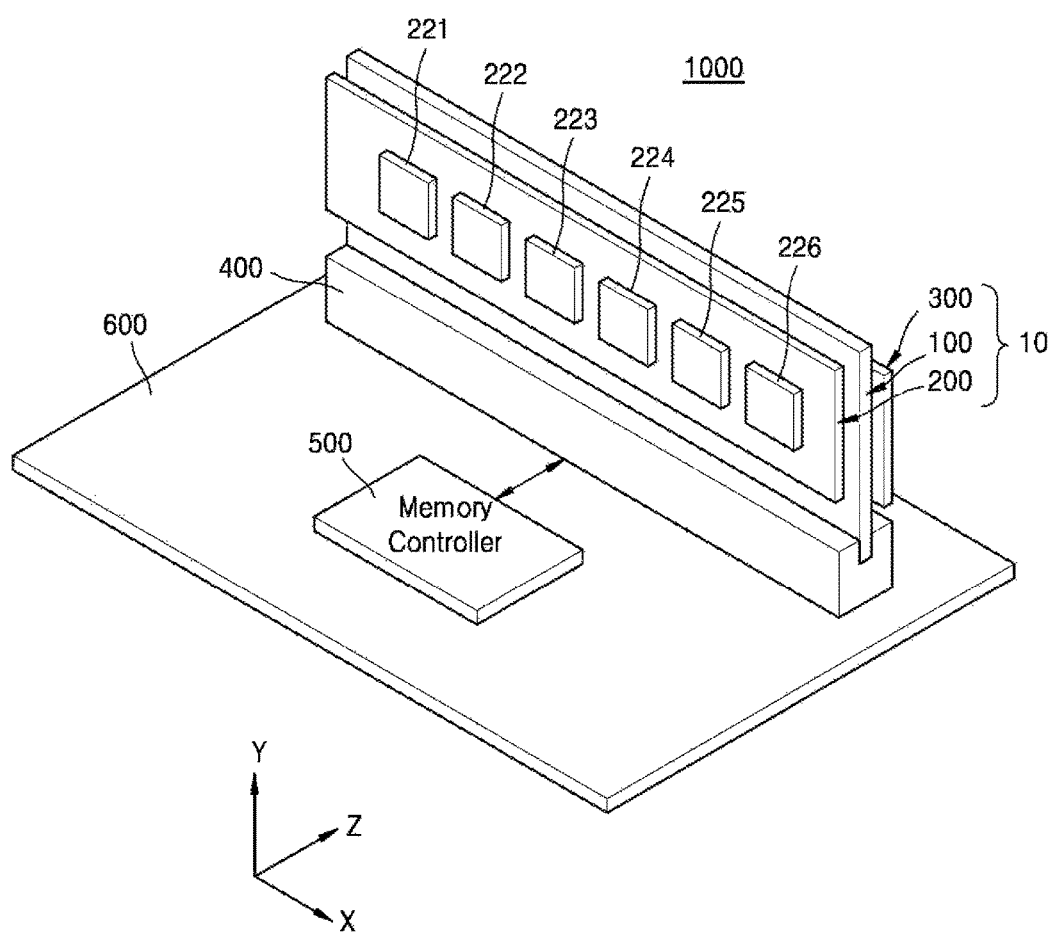
FIG. 1 is a schematic diagram showing a computing system including a memory system according to an exemplary embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Unless otherwise defined, all terms (including technical and scientific terms) used herein have the same meaning as commonly understood by one of ordinary skill in the art to which this disclosure belongs.

FIG. 1 is a schematic diagram showing a computing system 1000 including a memory system 10 according to an exemplary embodiment. The computing system 1000 may be a stationary computing system, such as a desktop computer, a server, and a workstation, or a mobile computing system, such as a laptop computer, a tablet computer, a personal digital assistant (PDA), a mobile phone, or a smart phone. As shown in FIG. 1, the computing system 1000 may include the memory system 10, a slot 400, a memory controller 500, and a system board 600.

Referring to FIG. 1, the memory system 10 may include a plurality of memory modules 100, 200, and 300 and may be referred to as a multi-module memory system. Each of the memory modules 100, 200, and 300 of the memory system 10 may include a semiconductor memory device. For example, each of the memory modules 100, 200, and 300 may include a volatile memory device, such as a dynamic random access memory (DRAM), static random access memory (SRAM), a mobile DRAM, a double data rate (DDR) synchronous dynamic random access memory (SDRAM), a low power DDR (LPDDR) SDRAM, a graphic DDR (GDDR) SDRAM, and a Rambus dynamic random access memory (RDRAM). Alternatively, each of the memory modules 100, 200, and 300 may include a nonvolatile memory device, such as an electrically erasable/ programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM). Although each of the memory modules 100, 200, and 300 are described below as including a DRAM, the inventive concept is not limited thereto.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, expansion memory module, memory card, hard drive including additional components, or a mobile phone, laptop, tablet, desktop, camera, or other consumer electronic device, etc.

The memory system 10 may include a base memory module 100 and expansion memory modules 200 and 300. The base memory module 100 may also be referred to as expandable base memory module as it can be expanded with expansion memory modules 200 and 300. The base memory module 100 may include a plurality of terminals (or module terminals) connected to the slot 400 and may communicate with the memory controller 500 via the slot 400 and a pattern formed at the system board 600. The plurality of module terminals of the base memory module 100 may include a conductive material for electric connection to the slot 400 or may include a light-conductive material for optical connection to the slot 400 as described below with reference to FIG. 12.

The base memory module 100 may be communicably connected to the expansion memory modules 200 and 300 and may provide a path via which the expansion memory modules 200 and 300 may communicate with the memory controller 500. For example, as described below with reference to FIG. 2, the base memory module 100 and the expansion memory modules 200 and 300 may be connected to each other via terminals (or first package terminals) arranged on surfaces of memory packages of the base memory module 100, and thus the base memory module 100 and the expansion memory modules 200 and 300 may be securely communicably-connected to each other.

As the plurality of memory modules 100, 200, and 300 of the memory system 10 communicate with the memory controller 500 via the single slot 400, spatial efficiency of the computing system 1000 may be improved. For example, unlike the embodiment shown in FIG. 1, in case of arranging a plurality of slots on a system board for respectively attaching a plurality of memory modules thereto, the plurality of slots may occupy a relatively large space on the system board, and unused slots from among the plurality of slots may unnecessarily occupy space of the system board. Therefore, as shown in FIG. 1, if the memory modules 100, 200, and 300 communicate with the memory controller 500 via the single slot 400, only the single slot 400 may be arranged on the system board 600 or a relatively small number of slots may be arranged on the system board 600. This results in a higher number of memory devices or a higher storage capacity per slot.

Unlike the embodiment shown in FIG. 1, if a plurality of memory modules are respectively connected to a plurality of slots and communicate with a memory controller, response times of the plurality of memory modules regarding a request of the memory controller may increase. For example, if a plurality of memory modules respectively connected to a plurality of slots share a same signal line (that is, a multi-drop structure), response times of the plurality of memory modules may increase due to increased load of the signal line. Furthermore, if each of a plurality of memory modules respectively connected to a plurality of slots includes a buffer and a memory controller and the plurality of memory modules communicate with each other via a plurality of buffers (that is, a cascaded structure), signals may be delayed and transmitted between the memory controller and the memory modules, and thus response times of the plurality of memory modules may increase.

According to an exemplary embodiment, as the memory modules 100, 200, and 300 of the memory system 10 communicate with the memory controller 500 via the single slot 400, response time of the memory system 10 regarding a request of the memory controller 500 may be improved. For example, as described below with reference to FIG. 3, a memory package of the base memory module 100 may include a buffer 137 that communicates with the memory controller 500 via the slot 400, and memory devices of the expansion memory modules 200 and 300 may communicate with the memory controller 500 via the buffer 137 included in the memory package of the base memory module 100. Therefore, a constant load on a signal line via which the memory controller 500 and the plurality of memory modules 100, 200, and 300 communicate with one another may be maintained. Furthermore, since the memory modules 100, 200, and 300 may communicate with the memory controller 500 via the single buffer 137, the memory system 10 which includes the memory modules 100, 200, and 300 may exhibit reduced response time regarding a request (e.g., read/write request) of the memory controller 500.

Figure 3:
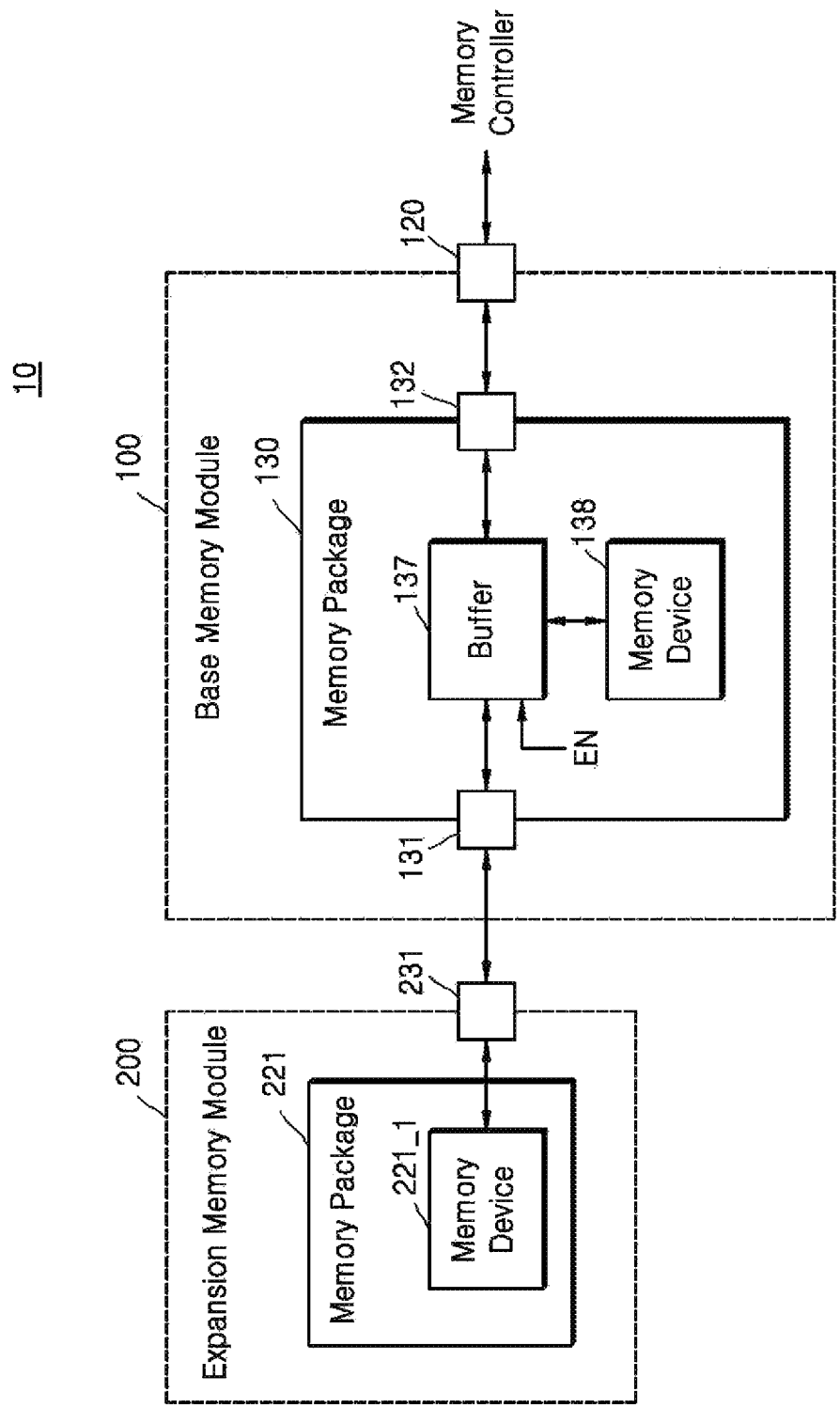
FIG. 3 is a block diagram showing the memory system 10 including the base memory module and the expansion memory module, according to an exemplary embodiment.

Referring to FIG. 1, the expansion memory module 200 may include a plurality of memory packages (or expansion memory packages) 221 through 226. As shown in FIG. 1, the memory packages 221 through 226 may be arranged on a surface of the expansion memory module 200 opposite to a surface of the expansion memory module 200 facing the base memory module 100. Each of the memory packages 221 through 226 may include a memory device (e.g., a DRAM), and the memory device may communicate with the memory controller 500 via a buffer 137 (as shown in FIG. 3) included in a memory package of the base memory module 100. Although FIG. 1 shows that the expansion memory module 200 includes the six memory packages 221 through 226, the expansion memory module 200 may include less than or more than six memory packages, according to embodiments. For example, the expansion memory module 200 may include two, three, four, five, seven, eight, nine, ten, eleven, or twelve memory packages, etc. but is not limited thereto. Furthermore, the expansion memory module 300 may have a structure that is similar or identical to a structure of the expansion memory module 200.

The slot 400 may have a structure allowing attachment and detachment of the base memory module 100 (or the memory system 10) and may include a plurality of terminals connected to module terminals of the base memory module 100. Similar to the module terminals of the base memory module 100, the terminals of the slot 400 may include a conductive material for electric connection to the base memory module 100 or may include a light-conductive material for optical connection to the base memory module 100 as described below with reference to FIG. 12.

The memory controller 500 may control the memory system 10 or the plurality of memory modules 100, 200, and 300. For example, the memory controller 500 may control an operation for writing data to memory devices included in the plurality of memory modules 100, 200, and 300 or an operation for reading out data stored in the memory devices. For example, the memory controller 500 may select at least one of memory devices included in the plurality of memory modules 100, 200, and 300 and transmit a write command or a read command to the selected at least one memory device. The selected memory device may write data or output data stored therein in response to a received command.

The system board 600 may include a pattern via which signals are transmitted between the memory controller 500 and the slot 400. For example, the system board 600 may be a printed circuit board (PCB) and include a plurality of patterns. Furthermore, a structure for mechanically fixing the slot 400, e.g., a hole, may be formed at the system board 600, where the slot 400 may be fixed to the system board 600 by the hole of the system board 600.

Figure 2:
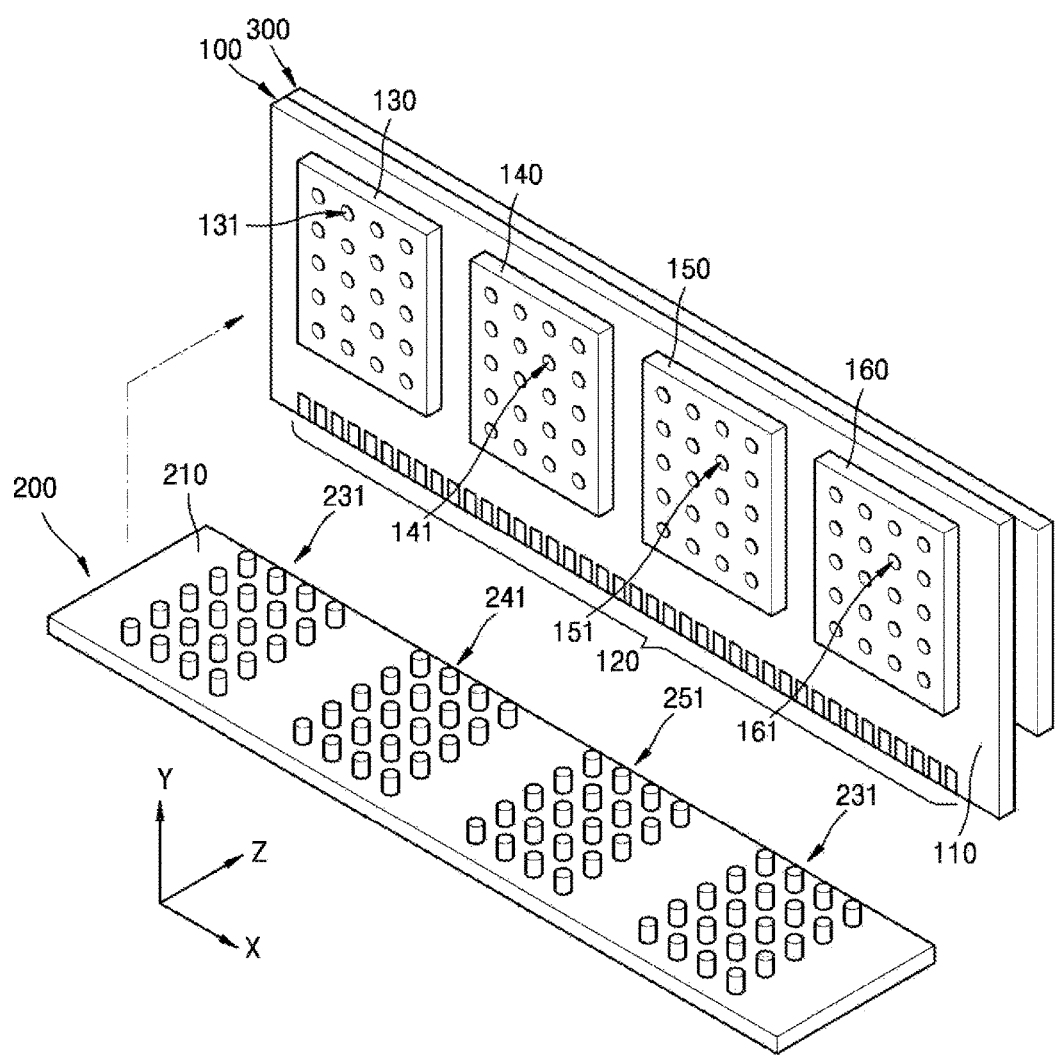
FIG. 2 is a schematic diagram showing an example wherein the base memory module and the expansion memory module are connected to each other, according to an exemplary embodiment.

FIG. 2 is a schematic diagram showing an example that the base memory module 100 and the expansion memory module 200 are connected to each other, according to an embodiment. FIG. 2 shows a state that the expansion memory module 200 is separated from the memory system 10. As described above with reference to FIG. 1, the base memory module 100 and the expansion memory module 200 may be communicably connected to each other via package terminals arranged on surfaces of memory packages of the base memory module 100.

Referring to FIG. 2, the base memory module 100 may include a module board 110, module terminals 120, and memory packages 130, 140, 150, and 160. Although only the memory packages 130, 140, 150, and 160 arranged on one of a pair of surfaces of the base memory module 100 facing each other are shown in FIG. 2, memory packages may be arranged on the other surface of the base memory module 100. For example, in some embodiments, memory packages may be arranged on the other one of the pair of surfaces of the base memory module 100 facing the expansion memory module 300 in a similar manner as the memory packages 130, 140, 150, and 160.

The module terminals 120 may be arranged at the module board 110 to be connected to the slot 400. As described above with reference to FIG. 1, the module terminals 120 may include a conductive material or a light-conductive material. In some embodiments, the module terminals 120 may be arranged at one edge of the module board 110, but the module board is not limited thereto.

According to an exemplary embodiment, the memory packages (or base memory packages) 130, 140, 150, and 160 included in the base memory module 100 may include first package terminals 131, 141, 151, and 161 to be connected to the expansion memory module 200, respectively. For example, as shown in FIG. 2, the memory package 130 may include a first surface attached to the module board 110 and a second surface opposite to the first surface facing away from the module board 110 and may include first package terminals 131 exposed on the second surface. If the expansion memory module 200 is attached to the base memory module 100, the first package terminals 131 of the memory package 130 may be connected to a plurality of conductive connecting elements 231 of the expansion memory module 200. According to an exemplary embodiment, the number of the first package terminals 131 and the number of the connecting elements 231 may differ from those shown in FIG. 2. Detailed exemplary descriptions of the first package terminals 131, 141, 151, and 161 will be given below with reference to FIGS. 5A through 5C.

As shown in FIG. 2, since the memory packages 130, 140, 150, and 160 include the first package terminals 131, 141, 151, and 161, the expansion memory module 200 (or the memory packages 221 through 226 of the expansion memory module 200 in FIG. 1) may be effectively communicably-connected to the base memory module 100 (or the memory packages 130, 140, 150, and 160 of the base memory module 100). For example, an additional space for connection to the expansion memory module 200 may be omitted at the module board 110, and the length of a path in which signals are transmitted between the memory packages 221 through 226 of the expansion memory module 200 and the first package terminals 131, 141, 151, and 161 of the base memory module 100 is reduced. Therefore, signal delay may be reduced.

Referring to FIG. 2, the expansion memory module 200 may include the module board 210 and connecting elements 231, 241, 251, and 261. Although not shown in FIG. 2, as shown in FIG. 1, the memory packages 221 through 226 may be arranged on a surface of the expansion memory module 200 facing a surface of the module board 210 having formed thereon the plurality of connecting elements 231, 241, 251, and 261. For example, the module board 210 may include a first surface that faces the base memory module 100 when the expansion memory module 200 is attached to the base memory module 100 and a second surface opposite to the first surface facing away from the base memory module 100. In this exemplary embodiment, the connecting elements 231, 241, 251, and 261 may be arranged on the first surface of the module board 210, and the memory packages 221 through 226 may be arranged on the second surface of the module board 210. When the expansion memory module 200 is attached to the base memory module 100, the connecting elements 231, 241, 251, and 261 may be connected to the first package terminals 131, 141, 151, and 161, respectively. Detailed descriptions of the connecting elements 231, 241, 251, and 261 will be given below with reference to FIGS. 9A through 9C.

FIG. 3 is a block diagram showing the memory system 10 including the base memory module 100 and the expansion memory module 200, according to an exemplary embodiment. Although FIG. 3 shows that each of the base memory module 100 and the expansion memory module 200 includes a single memory package 130 or 221, respectively, for convenience of explanation, the inventive concept is not limited thereto.

Referring to FIG. 3, the base memory module 100 may include the module terminals 120 and the memory package 130, whereas the expansion memory module 200 may include the connecting elements 231 and the memory package 221. The base memory module 100 may communicate with a memory controller (e.g., the memory controller 500 as illustrated in FIG. 1) via the module terminals 120, whereas the expansion memory module 200 may be communicably connected to the base memory module 100 via the connecting elements 231.

The memory package (that is, a base memory package) 130 of the base memory module 100 may include first and second package terminals 131 and 132, a buffer 137, and a memory device 138. As described above with reference to FIG. 2, the first package terminals 131 may be exposed on a surface of the memory package 130 to be connected to the expansion memory module 200. Furthermore, the second package terminals 132 may be exposed on the other surface of the memory package 130 (that is, a surface opposite to the surface having exposed thereon the first package terminals 131) to be connected to the module board 110 of FIG. 2.

The memory device 138 (e.g., a DRAM) may include a memory cell array consisting of a plurality of memory cells for storing data and may communicate with the buffer 137. The buffer 137 may be connected to the first and second package terminals 131 and 132 and the memory device 138 and may temporarily store data input to or output from the memory device 138 of the base memory module 100 and a memory device 221_1 of the expansion memory module 200. For example, the buffer 137 temporarily stores data transmitted between a memory controller (e.g., the memory controller 500 as illustrated in FIG. 1) and the memory devices 138 and 221_1 for normal data transmission between the memory controller and the memory devices 138 and 221_1. As shown in FIG. 3, the buffer 137 embodied in the memory package 130 including the memory device 138 may be referred to as an on-package buffer.

According to an exemplary embodiment, the buffer 137 may be selectively activated. For example, if the expansion memory module 200 is not attached to the base memory module 100, that is, if the base memory module 100 operates alone, the buffer 137 may be deactivated and may not temporarily store data output by or input to the memory device 138 and the data may bypass the buffer 137. For example, as shown in FIG. 3, the buffer 137 may receive an enable signal EN, wherein the enable signal EN may be activated or deactivated based on whether the expansion memory module 200 is attached to the base memory module 100. According to an embodiment, the base memory module 100 may include a circuit (not shown) that automatically activates an enable signal EN when the expansion memory module 200 is attached to the base memory module 100. According to another embodiment, an enable signal EN may be activated or deactivated by a memory controller (e.g., the memory controller 500 as illustrated in FIG. 1).

The memory package (that is, the expansion memory package) 221 of the expansion memory module 200 may include the memory device 221_1. The memory device 221_1 may include a memory cell array consisting of a plurality of memory cells for storing data and may be a memory device of a same type as the memory device 138 of the base memory module 100. The memory device 221_1 may communicate with the buffer 137 of the memory package 130 of the base memory module 100 via the connecting elements 231 and the first package terminals 131. Data output by or input to the memory device 221_1 may be temporarily stored in the buffer 137.

Figure 4:
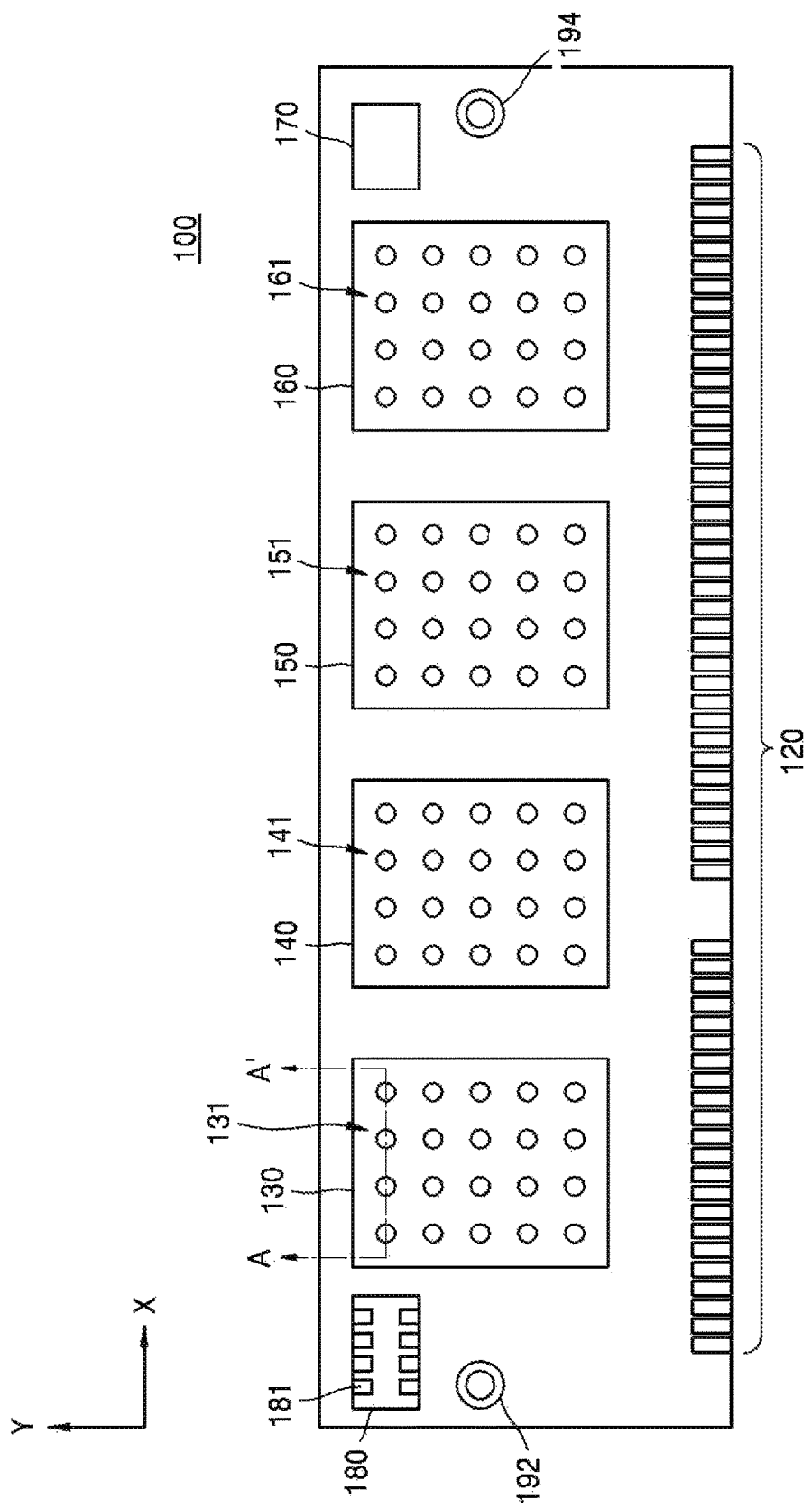
FIG. 4 is a plan view of the base memory module according to an exemplary embodiment.

FIG. 4 is a plan view of the base memory module 100 according to an exemplary embodiment. As shown in FIG. 4, the base memory module 100 may include the module board 110, the module terminals 120, the memory packages 130, 140, 150, and 160, a serial presence detect (SPD) apparatus 170, a connector 180, and attachment elements 192 and 194.

The SPD apparatus 170 may provide SPD data corresponding to the base memory module 100. SPD is a standardized method of providing information regarding a memory module, where the SPD apparatus 170 may provide SPD data including information regarding the base memory module 100, e.g., data storage capacity, clock cycle time, bank address, refresh information, etc. A memory controller may read out SPD data provided by the SPD apparatus 170 via at least one of the module terminals 120 and control the base memory module 100 based on the read-out SPD data. According to an embodiment, the SPD apparatus 170 may include a ROM (e.g., an EEPROM) as a non-volatile memory device, where the ROM may store SPD data therein.

The connector 180 may provide at least one signal path or power path when a expansion memory module (e.g., the expansion memory module 200 of FIG. 2) is attached to the base memory module 100. For example, the base memory module 100 may be connected to an expansion memory module (e.g., the expansion memory module 200 or the expansion memory module 300) to communicate with the expansion memory module via the connector 180 other than paths provided by the first package terminals 131, 141, 151, and 161 of the memory packages 130, 140, 150, and 160. For example, as shown in FIG. 4, the connector 180 may include at least one contact 181, and the contact 181 may be electrically connected to a power node of the base memory module 100. Furthermore, as described below with reference to FIGS. 10A and 10B, the contact 181 may provide a path via which SPD data of an expansion memory module is received by the base memory module 100.

The attachment elements 192 and 194 may be used to fix or attach an expansion memory module to the base memory module 100. For example, the attachment elements 192 and 194 may have a structure to which attachment screws may be inserted. Here, the attachment screws may be inserted to the attachment elements 192 and 194, and thus the expansion memory module may be fixed to the base memory module 100. Although FIG. 4 shows that the attachment elements 192 and 194 have circular shapes, the attachment elements 192 and 194 may have any one of various structures for fixing the base memory module 100 and an expansion memory module.

According to an exemplary embodiment, the attachment elements 192 and 194 may include a conductor. For example, the attachment elements 192 and 194 may provide a signal path or a power path between the base memory module 100 and an expansion memory module. For example, the attachment elements 192 and 194 may be electrically connected to a power node of the base memory module 100, e.g., a power voltage node VDD or a ground voltage node VSS, where an expansion memory module may receive power from the base memory module 100 via the attachment elements 192 and 194.

Figure 5B:
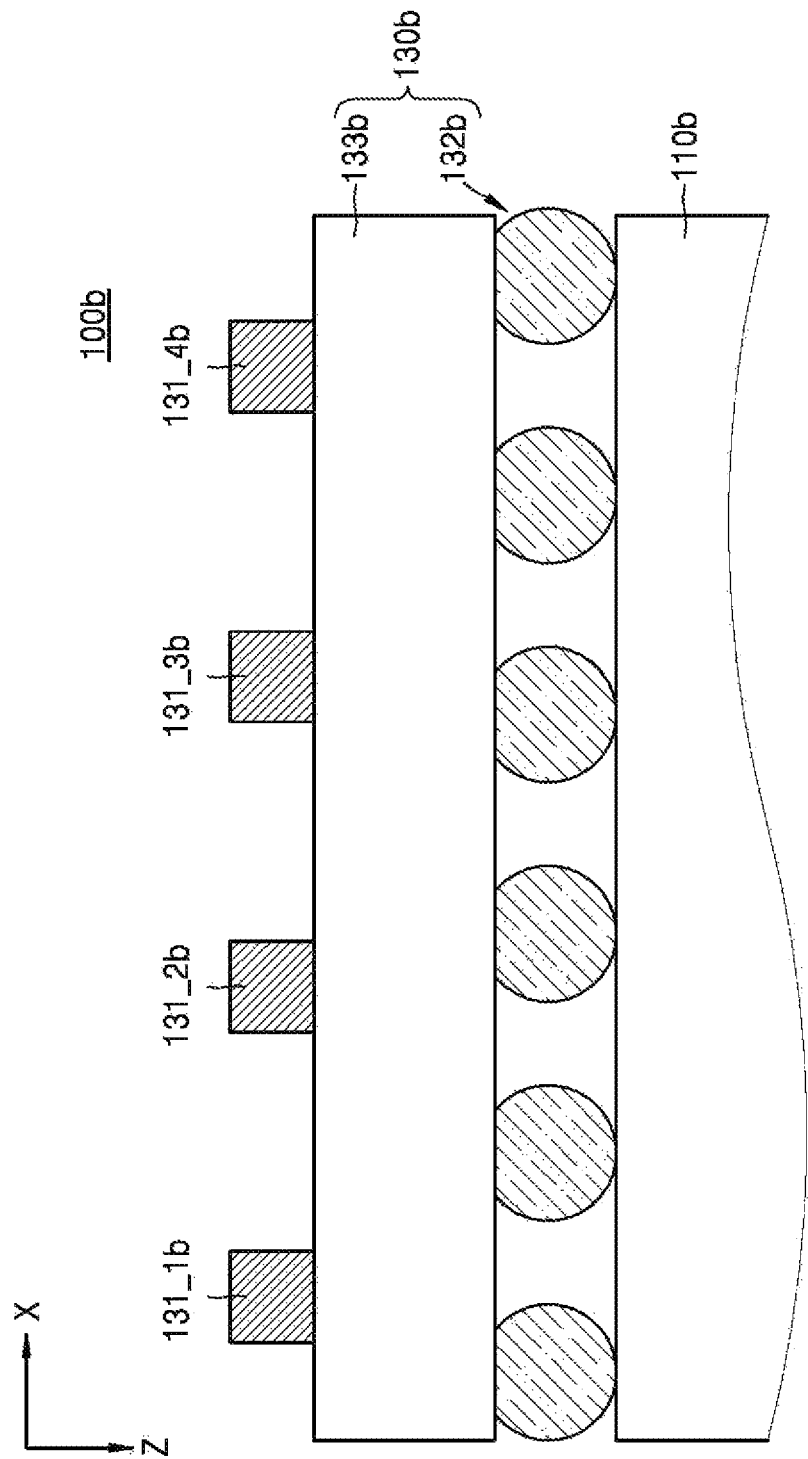

FIGS. 5A through 5C are diagrams showing example cross-sections of the base memory module 100 taken along a line A-A' of FIG. 4, according to example embodiments. In detail, FIGS. 5A through 5C are diagrams showing examples of the first package terminals 131 included in the memory package 130 of the base memory module 100 according to example embodiments. However, the inventive concept is not limited to the examples shown in FIGS. 5A through 5C, and the first package terminals 131 according to an embodiment may have other structures that are not shown in FIGS. 5A through 5C.

In FIGS. 5A through 5C, memory packages 130a, 130b, and 130c may include second package terminals 132a, 132b, and 132c that are connected to module boards 110a, 110b, and 110c, respectively, where the second package terminals 132a, 132b, and 132c may be embedded as balls or bumps. Furthermore, according to an exemplary embodiment, the memory packages 130a, 130b, and 130c may include epoxy molding compound (EMC)-containing encapsulating materials 133a, 133b, and 133c, but is not limited thereto. For convenience of explanation, the internal structures of the memory packages 130a, 130b, and 130c are omitted in FIGS. 5A through 5C.

Referring to FIG. 5A, according to an exemplary embodiment, package terminals 131_1a through 131_4a may be pads. For example, the package terminals 131_1a through 131_4a may extend from a first surface (e.g., upper surface) of the encapsulating material 133a to locations inside an encapsulating material 133a (that is, locations in the z-axis direction) spaced apart from each other. The package terminals 131_1a through 131_4a may include a conductor, e.g., a metal, and may be exposed out of the memory package 130a. According to an exemplary embodiment, the second package terminals 132a may be provided at a second surface (e.g., lower surface) of the encapsulating material 133a opposite to the first surface of the encapsulating material 133a where the package terminals 131_1a through 131_4a are formed. In some embodiments, the number of package terminals 131_1a through 131_4a provided on the first surface of the encapsulating material 133a may be less than the number of second package terminals 132a formed on the second surface of the encapsulating material 133a, but the disclosure is not limited thereto.

Referring to FIG. 5B, according to an exemplary embodiment, package terminals 131_1b through 131_4b may be pins and may be provided on a first surface (e.g., upper surface) of an encapsulating material 133b spaced apart from each other. For example, the package terminals 131_1b through 131_4b may protrude from an encapsulating material 133b (in the negative z-axis direction). The package terminals 131_1b through 131_4b may include a conductor, e.g., a metal, and may be exposed out of the memory package 130b. According to an exemplary embodiment, the second package terminals 132b may be provided spaced apart from each other at a second surface (e.g., lower surface) of the encapsulating material 133b opposite to the first surface of the encapsulating material 133b where the package terminals 131_1b through 131_4b are formed. In some embodiments, the number of package terminals 131_1b through 131_4b provided on the first surface of the encapsulating material 133b may be less than the number of second package terminals 132b provided on the second surface of the encapsulating material 133b, but is not limited thereto.

Referring to FIG. 5C, according to an embodiment, package terminals 131_1c through 131_4c may be balls or bumps and may be provided on a first surface (e.g., upper surface) of an encapsulating material 133c spaced apart from each other. For example, the package terminals 131_1c through 131_4c may be balls or bumps formed on bump pads inside an encapsulating material 133c. The package terminals 131_1c through 131_4c may include a conductor, e.g., a metal, and may be exposed out of the memory package 130c. According to an exemplary embodiment, the second package terminals 132c may be provided at a second surface (e.g., lower surface) of the encapsulating material 133c opposite to the first surface of the encapsulating material 133c where the package terminals 131_1c through 131_4c are formed. In some embodiments, the number of package terminals 131_1c through 131_4c provided on the first surface of the encapsulating material 133c may be less than the number of second package terminals 132c provided on the second surface of the encapsulating material 133c, but is not limited thereto. The various package terminals for connecting between a surface of the packages opposite the surface that connects to the module board 110 and the expansion modules 200 or 300 may be referred to herein as inter-module connection terminals.

FIGS. 6A through 6D are diagrams showing examples of internal structures of the memory package 130 of FIG. 4, according to example embodiments. In detail, FIGS. 6A through 6D show examples of cross-sections of the memory package 130 taken along the line A-A' of FIG. 4. For convenience of illustration, an encapsulating material of the memory package 130 is not shown in FIGS. 6A through 6D, and descriptions given with respect to FIG. 6A will be omitted in descriptions regarding FIGS. 6B through 6D.

Figure 6A:
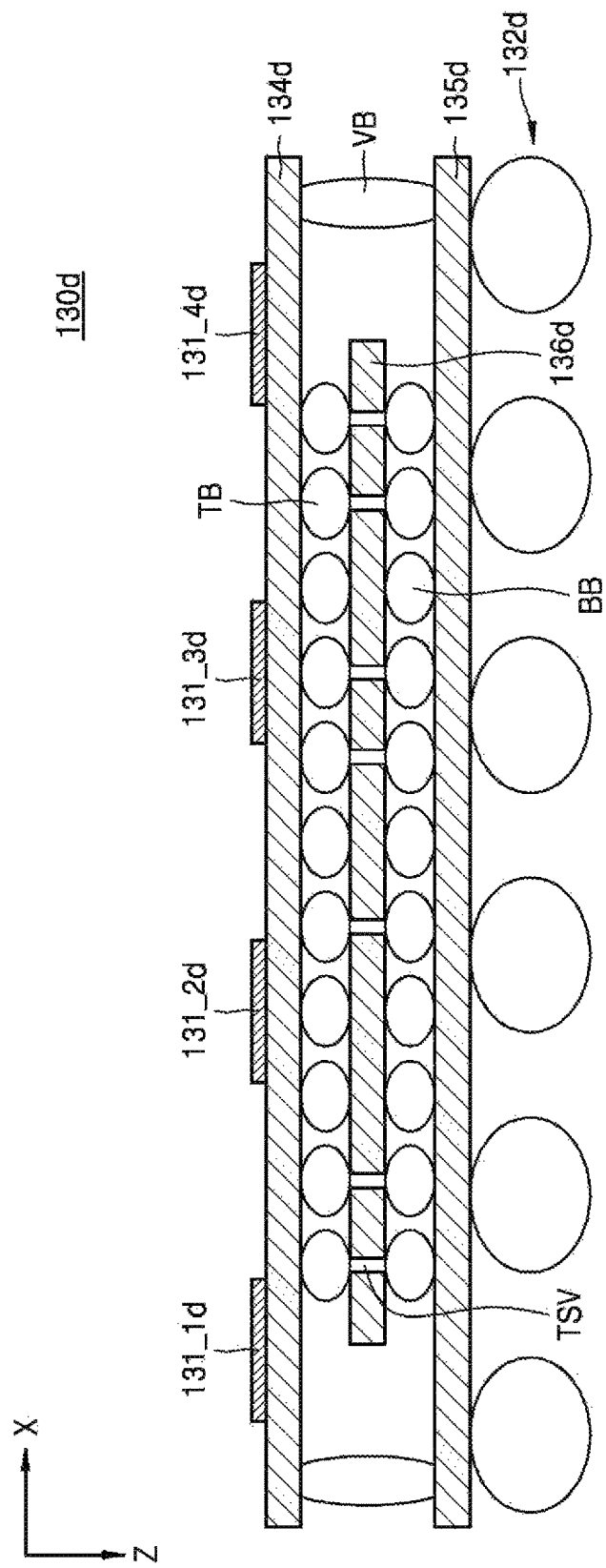
FIGS. 6A through 6D are diagrams showing examples of internal structures of the memory package of FIG. 4, according to example embodiments.

Referring to FIG. 6A, a memory package 130d may include first and second substrates 134d and 135d that are arranged in parallel to each other. According to an exemplary embodiment, each of the first and second substrates 134d and 135d may be a printed circuit board (PCB), an interposer, or a silicon substrate, but the disclosure is not limited thereto. According to an exemplary embodiment, the first and second substrates 134d and 135d may be stacked based on a package-on-package technique. First package terminals 131_1d through 131_4d to be connected to an expansion memory module (e.g., the expansion memory module 200 of FIG. 2) may be arranged on the first substrate 134d, whereas second package terminals 132d to be connected to the module board 110 of the base memory module 100 may be arranged on the second substrate 135d. The first and second substrates 134d and 135d may be electrically connected to each other via at least one via bump VB including a conductor. According to an embodiment, at least one of the first package terminals 131_1d through 131_4d may be electrically connected to a power node of the memory package 130d and may be electrically connected to a power node of the base memory module 100 via at least one of a pattern formed at the first substrate 134d, at least one via bump VB, a pattern formed at the second substrate 135d, and the second package terminals 132d. Furthermore, the memory package 130d may include an integrated circuit (or a die having formed thereat an integrated circuit) 136d that is arranged between the first and second substrates 134d and 135d. The integrated circuit 136d may consist of a plurality of layers and may include the buffer 137 and the memory device 138 of FIG. 3.

Referring to FIG. 6A, the integrated circuit 136d may be electrically connected to the first substrate 134d via at least one top micro-bump TB including a conductor and may be electrically connected to the second substrate 135d via at least one bottom micro-bump BB including a conductor. In some embodiments, the package terminals 131_1d through 131_4d may be provided spaced apart from each other at a first surface (e.g., upper surface) of the first substrate 134d, at least one top micro-bump TB may be provided between a second surface (e.g., lower surface) of the first substrate 134d opposite to the first surface of the first substrate 134d where the package terminals 131_1d through 131_4d are provided and a first surface (e.g., upper surface) of the integrated circuit 136d. Therefore, in the embodiment shown in FIG. 6A, the buffer 137 of FIG. 3 included in the integrated circuit 136d may be electrically connected to at least one of the first package terminals 131_1d through 131_4d via the top micro-bump TB and the pattern formed at the first substrate 134d. Furthermore, in some embodiments, at least one bottom micro-bump BB may be provided between a second surface (e.g., lower surface) of the integrated circuit 136d and a first surface (e.g., upper surface of the second substrate 135d and the second package terminals 132d may be provided at a second surface (e.g., lower surface) of the second substrate 135d. Therefore, the buffer 137 of FIG. 3 included in the integrated circuit 136d may further be electrically connected to at least one of the second package terminals 132d via the bottom micro-bump BB and the pattern formed at the second substrate 135d. The integrated circuit 136d may include at least one through substrate via (e.g., silicon via) (TSV), where the top micro-bump TB and the bottom micro-bump BB may be electrically connected to each other via the TSV.

Figure 6B:
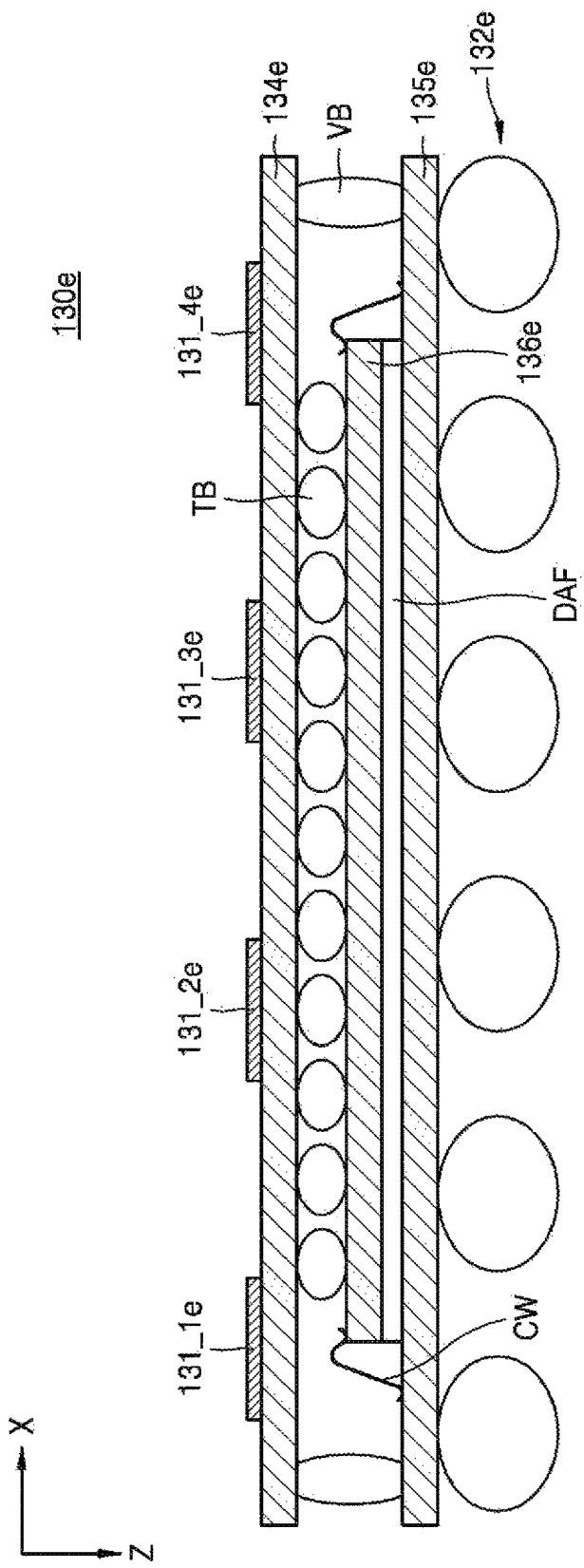

Referring to FIG. 6B, an integrated circuit 136e may be arranged on a die attach film DAF arranged on a second substrate 135e. In some embodiments, the package terminals 131_1e through 131_4e may be provided spaced apart from each other at a first surface (e.g., upper surface) of the first substrate 134e, at least one top micro-bump TB may be provided between a second surface (e.g., lower surface) of the first substrate 134e opposite to the first surface of the first substrate 134e where the package terminals 131_1e through 131_4e are provided and a first surface (e.g., upper surface) of the integrated circuit 136e. In some embodiments, the integrated circuit 136e may be electrically connected to a first substrate 134e via at least one top micro-bump TB including a conductor and may be electrically connected to the second substrate 135e via at least one wire CW including a conductor. Therefore, in the embodiment shown in FIG. 6B, the buffer 137 of FIG. 3 included in the integrated circuit 136e may be electrically connected to at least one of first package terminals 131_1e through 131_4e via at least one top micro-bump TB and a pattern formed at the first substrate 134e. Furthermore, the buffer 137 of FIG. 3 included in the integrated circuit 136e may be electrically connected to at least one of second package terminals 132e via at least one wire CW and a pattern formed at the second substrate 135e.

Figure 6C:
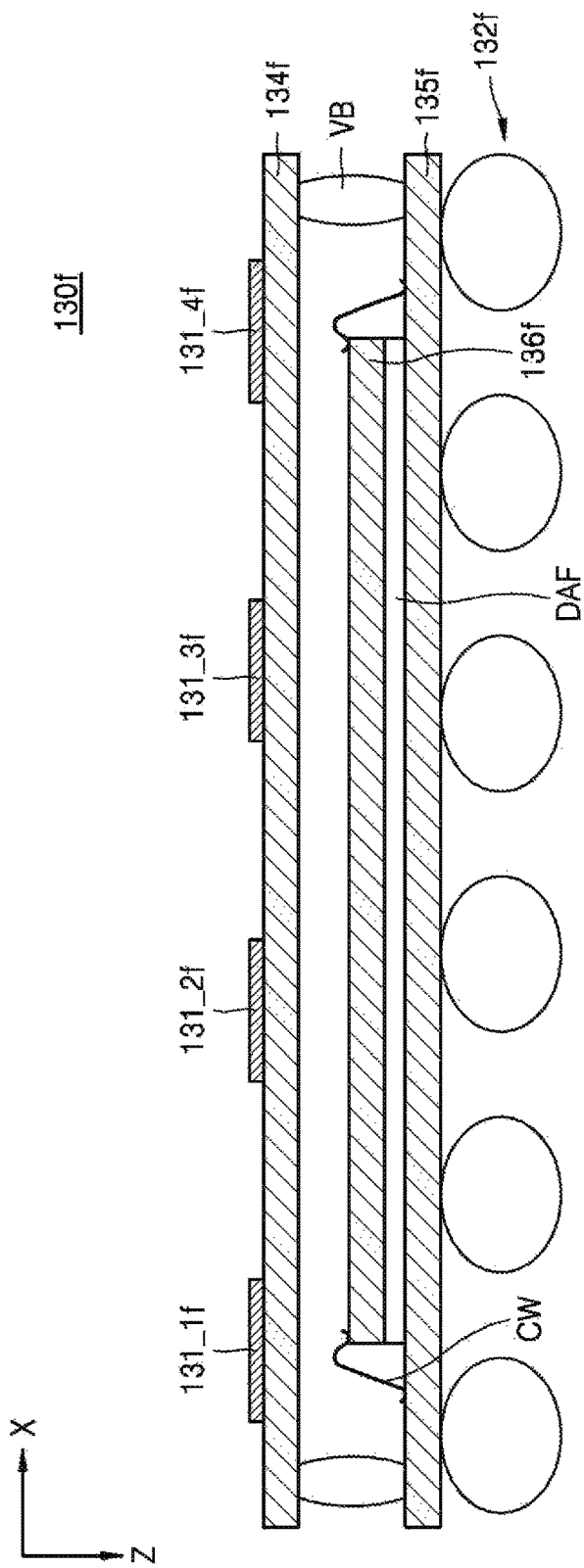

Referring to FIG. 6C, an integrated circuit 136f may be arranged on a die attach film DAF arranged on a second substrate 135f. The integrated circuit 136f may be electrically connected to the second substrate 135f via at least one wire CW including a conductor. Therefore, in the embodiment shown in FIG. 6C, the buffer 137 of FIG. 3 included in the integrated circuit 136f may be electrically connected to at least one of first package terminals 131_1f through 131_4f via at least one wire CW, a pattern formed at the second substrate 135f, at least one via bump VB, and a pattern formed at a first substrate 134f. Furthermore, the buffer 137 of FIG. 3 included in the integrated circuit 136f may be electrically connected to at least one of second package terminals 132f via at least one wire CW and the pattern formed at the second substrate 135f.

Figure 6D:
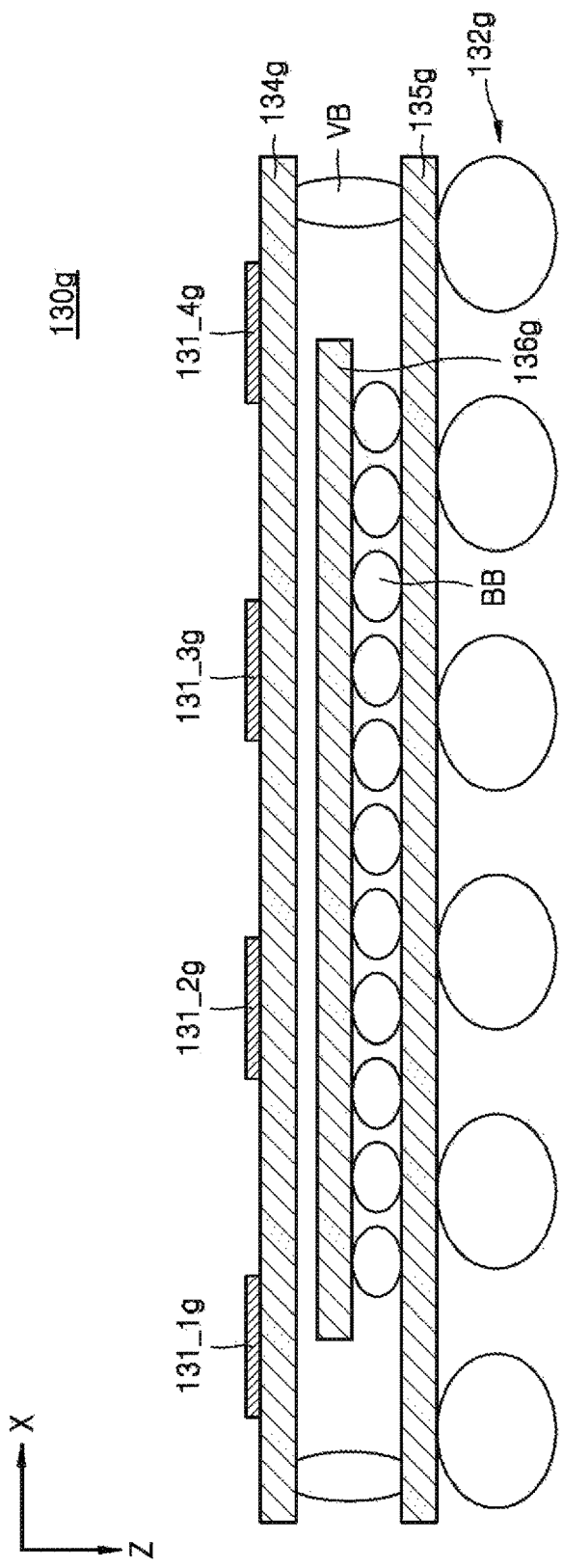

Referring to FIG. 6D, an integrated circuit 136g may be electrically connected to a second substrate 135g via at least one bottom micro-bump BB including a conductor. In some embodiments, at least one bottom micro-bump BB may be provided between a lower surface of the integrated circuit 136g and an upper surface of the second substrate 135g facing the lower surface of the integrated circuit 136g and the second package terminals 132g may be provided at a lower surface of the second substrate 135g facing away from the lower surface of the integrated circuit 136g. Therefore, in the embodiment shown in FIG. 6D, the buffer 137 of FIG. 3 included in the integrated circuit 136g may be electrically connected to at least one of the first package terminals 131_1g through 131_4g via at least one bottom micro-bump BB, a pattern formed at the second substrate 135g, at least one via bump VB, and a pattern formed at the first substrate 134g. Furthermore, the buffer 137 of FIG. 3 included in the integrated circuit 136g may be electrically connected to at least one of second package terminals 132g via at least one bottom micro-bump BB and the pattern formed at the second substrate 135g.

The first substrate 134d, 134e, 134f, and 134g in FIGS. 6A-6D may also be referred to as a first package substrate and the second substrate 135d, 135e, 135f, and 135g in FIGS. 6A-6D may also be referred to as a second package substrate. The integrated circuits 136d, 136e, 136f, and 136g in FIGS. 6A-6D may also be referred to as a semiconductor device which may refer to a device such as a semiconductor chip (e.g., memory chip and/or logic chip formed on a die), or a stack of semiconductor chips. In some embodiments, the first package substrates and second package substrates may be formed of an insulative material such as a printed circuit board (PCB), and may not have any integrate circuits thereon. In some embodiments, one or both of the first package substrate and second package substrate may be chip substrates that also serve as outermost package substrates, and that include integrated circuits thereon.

Figure 7:
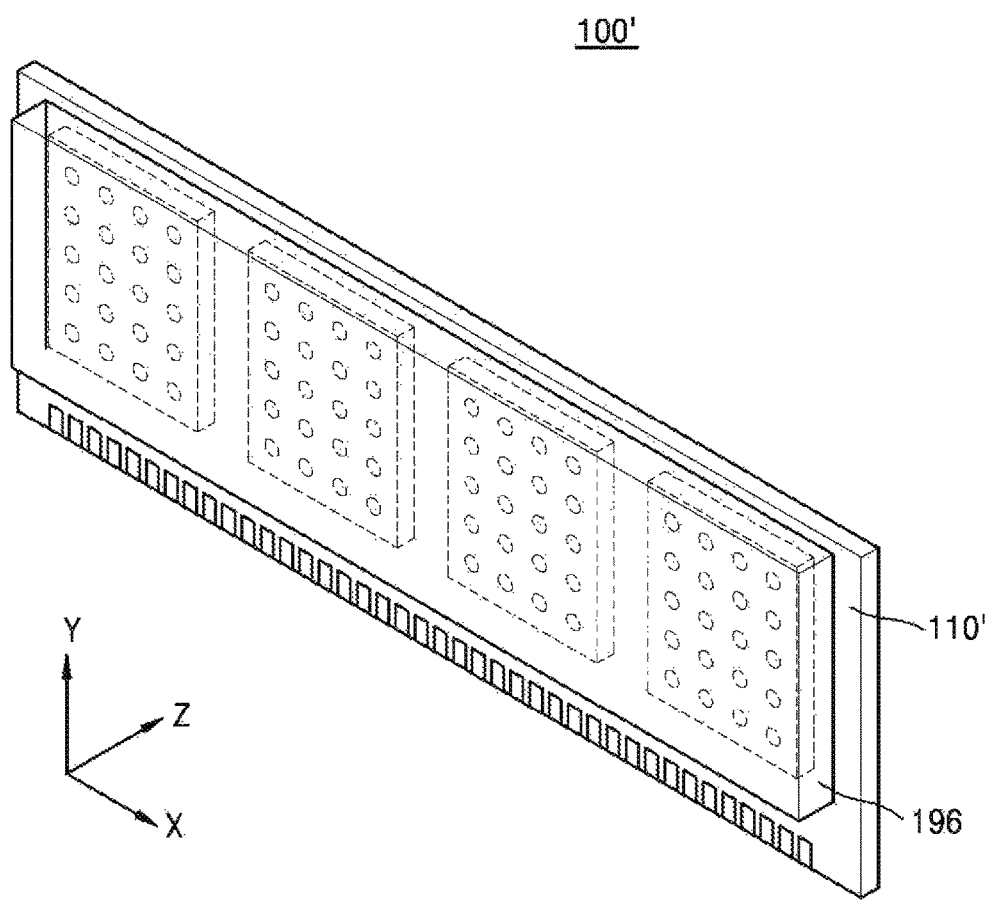
FIG. 7 is a diagram showing a base memory module according to an exemplary embodiment.

FIG. 7 is a diagram showing a base memory module 100' according to an exemplary embodiment. As described above with reference to FIG. 2, the base memory module 100' may include memory packages including exposed first package terminals.

Referring to FIG. 7, the base memory module 100' may include a cover 196 including an insulator. The cover 196 may insulate exposed first package terminals of the base memory module 100' to be connected to an expansion memory module (e.g., the expansion memory module 200 of FIG. 2) from outside of the base memory module 100'. The cover 196 may be attached to and detached from the base memory module 100' (or a module board 110') and may be detached when an expansion memory module is attached to the base memory module 100'.

FIG. 8 is a plan view of the expansion memory module 200 according to an exemplary embodiment. As shown in FIG. 8, the expansion memory module 200 may include the module board 210, the connecting elements 231, 241, 251, and 261, a SPD apparatus 270, a connector 280, and attachment elements 292 and 294.

Similar to the SPD apparatus 170 of FIG. 4, the SPD apparatus 270 may provide information regarding the expansion memory module 200. The SPD apparatus 270 may include a ROM as a non-volatile memory device, where the ROM may store SPD data regarding the expansion memory module 200.

The connector 280 may be connected to the connector 180 of FIG. 4 when the expansion memory module 200 is attached to the base memory module 100 of FIG. 4. For example, at least one contact 281 included in the connector 280 may be connected to the at least one contact 181 included in the connector 180 of FIG. 4, and thus a signal path or a power path may be established between the expansion memory module 200 and the base memory module 100 of FIG. 4.

The attachment elements 292 and 294 may be used to fix or attach the expansion memory module 200 to the base memory module 100 of FIG. 4. For example, the attachment elements 292 and 294 may be connected to the attachment elements 192 and 194 of FIG. 4. According to an embodiment, the attachment elements 292 and 294 may include a conductor, and thus the attachment elements 292 and 294 may form a signal path or a power path between the expansion memory module 200 and the base memory module 100 of FIG. 4, together with the attachment elements 192 and 194 of FIG. 4.

Figure 9A:
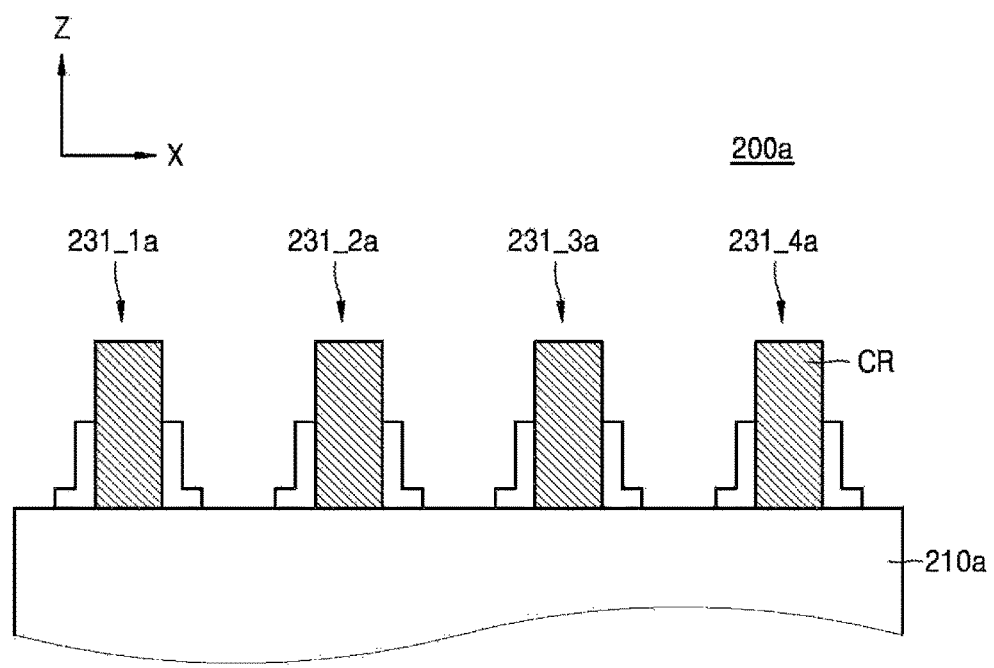
FIGS. 9A through 9C are diagrams showing example cross-sections of the expansion memory module taken along a line B-B of FIG. 4, according to example embodiments.
Figure 9B:
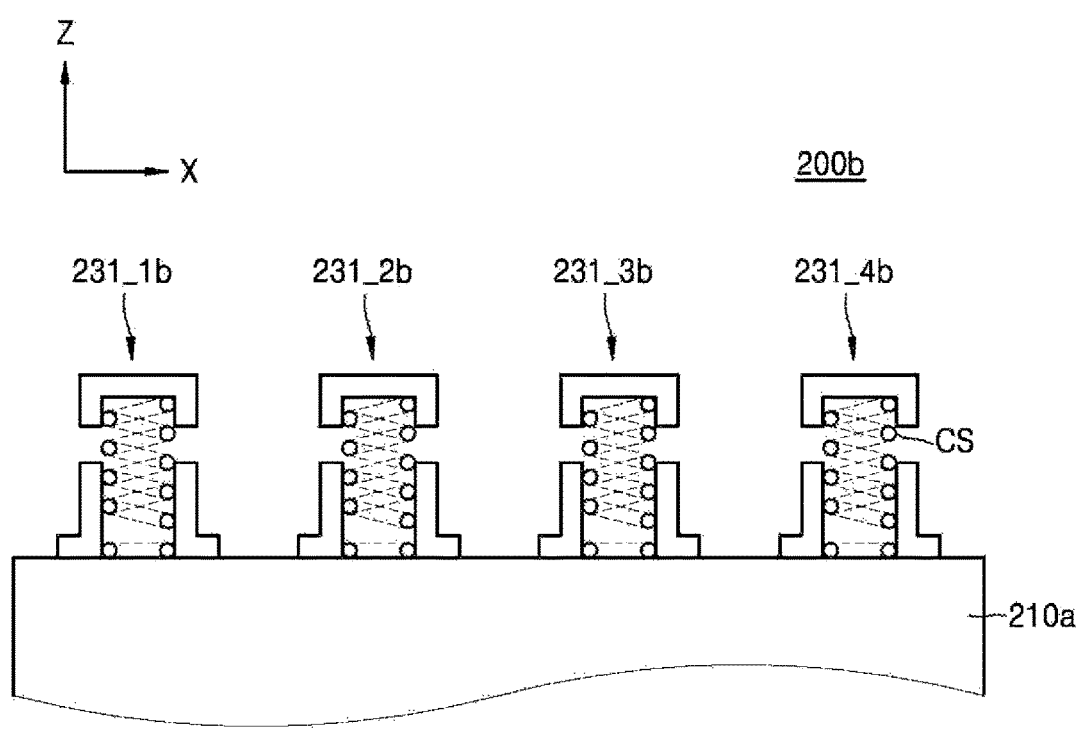
Figure 9C:
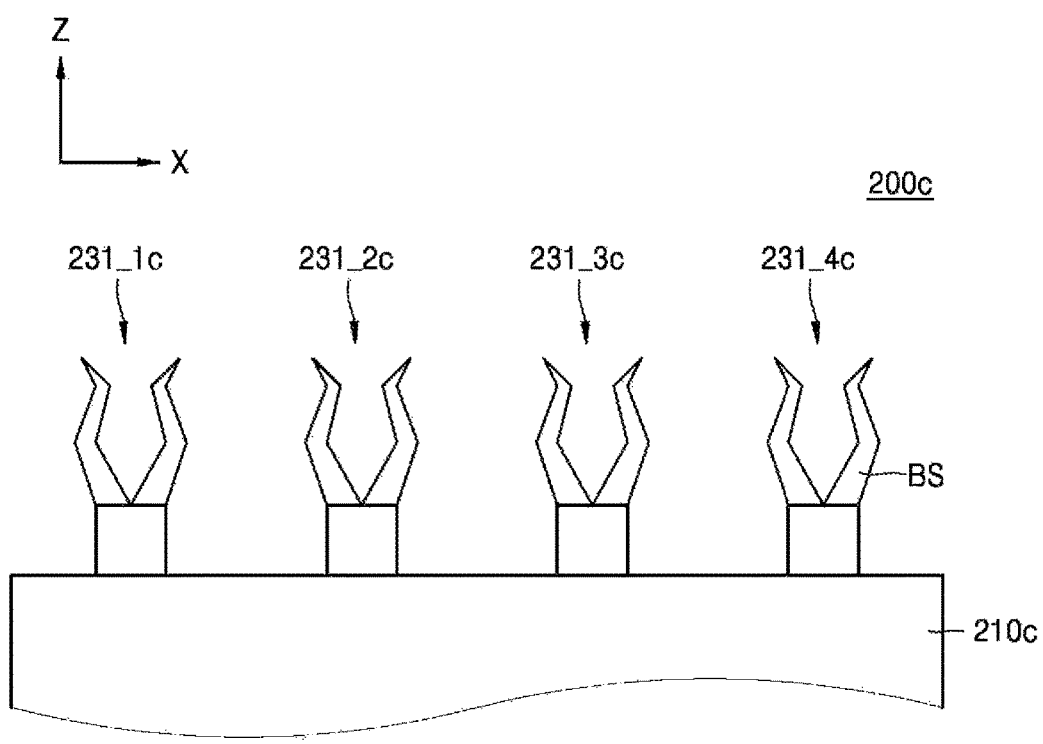

FIGS. 9A through 9C are diagrams showing example cross-sections of the expansion memory module 200 taken along a line B-B' of FIG. 4, according to embodiments. In detail, FIGS. 9A through 9C are diagrams showing examples of the connecting elements 231 of the expansion memory module 200 according to embodiments. However, the inventive concept is not limited to the examples shown in FIGS. 9A through 9C, and the connecting elements 231 according to an embodiment may have other structures that are not shown in FIGS. 9A through 9C. Descriptions regarding FIGS. 9A through 9C will be given below with reference to FIG. 2.

Referring to FIG. 9A, each of connecting elements 231_1a through 231_4a may include a conductive rubber CR. The conductive rubber CR may include a conductive material and may have elasticity. If the conductive rubber CR is compressed, the conductivity of the conductive rubber CR may increase (for example, the resistance of the conductive rubber CR may decrease). As shown in FIG. 9A, the conductive rubber CR may be connected to a module board 210a. When an expansion memory module 200a is attached to the base memory module 100, the conductive rubber CR included in each of the connecting elements 231_1a through 231_4a may be connected to the first package terminals 131 included in the memory package 130 of the base memory module 100 and may be compressed in the negative z-axis direction. Therefore, the module board 210a of the expansion memory module 200a (or the memory packages 221 through 226 of FIG. 1) and the base memory module 100 may be electrically connected to each other. In some embodiments, the shape of the conductive rubber CR may be rectangular or square, but is not limited thereto. The conductive rubber CR may be formed of other geometrical shapes.

Referring to FIG. 9B, each of the connecting elements 231_1b through 231_4b may include a spring CS including a conductor, and the spring CS may be elastically arranged in the z-axis direction perpendicular to a module board 210b. As shown in FIG. 9B, the spring CS may be connected to the module board 210b. When an expansion memory module 200b is attached to the base memory module 100, the spring CS included in each of the connecting elements 231_1b through 231_4b may be connected to the first package terminals 131 included in the memory package 130 of the base memory module 100 and may be compressed in the negative z-axis direction. Therefore, the module board 210b of the expansion memory module 200b (or the memory packages 221 through 226 of FIG. 1) and the base memory module 100 may be electrically connected to each other.

Referring to FIG. 9C, each of the connecting elements 231_1c through 231_4c may include a ball socket BS including a conductor, where the ball socket BS may have elasticity in an arbitrary direction perpendicular to the z-axis direction (e.g., the x-axis direction or the y-axis direction). In some embodiments, the ball socket BS may surround a pin, a ball, or a bump, and thus the ball socket BS may be connected to the pin, the ball, or the bump. As shown in FIG. 9C, the ball socket BS may be connected to a module board 210c. When an expansion memory module 200c is attached to the base memory module 100, the ball socket BS included in each of the connecting elements 231_1c through 231_4c may expand in a direction perpendicular to the z-axis direction and connected to the first package terminals 131 included in the memory package 130 of the base memory module 100. Therefore, the module board 210c of the expansion memory module 200c (or the memory packages 221 through 226 of FIG. 1) and the base memory module 100 may be electrically connected to each other.

Figure 10A:
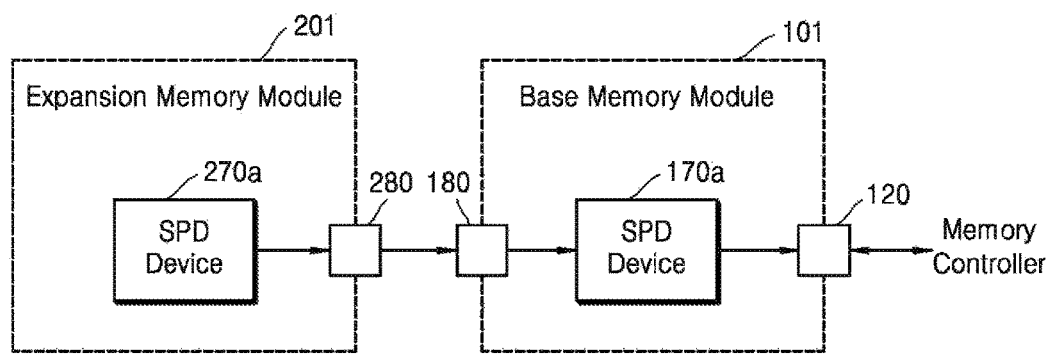
FIGS. 10A and 10B are diagrams showing examples wherein serial presence detect (SPD) data of an expansion memory module is transmitted to a memory controller, according to example embodiments.
Figure 10B:
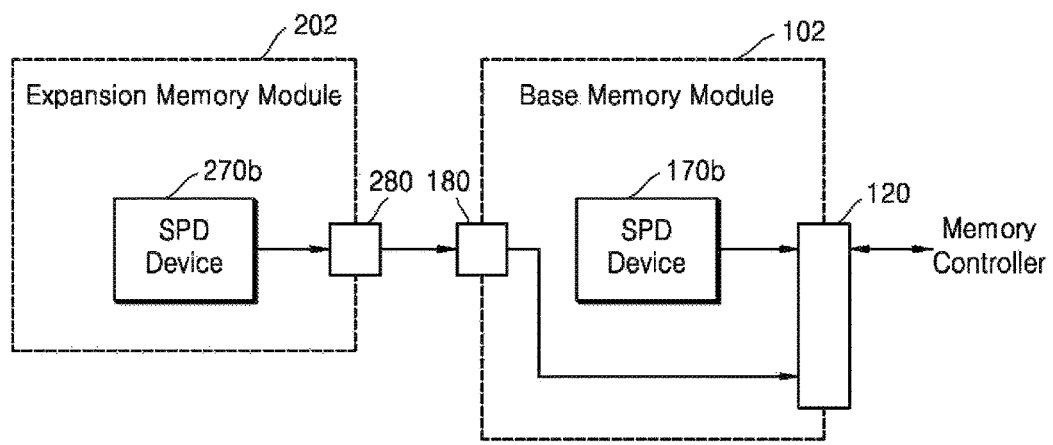

FIGS. 10A and 10B are diagrams showing examples that SPD data of an expansion memory module is transmitted to a memory controller, according to example embodiments. As described above with reference to FIGS. 4 and 8, each of the base memory module 100 and the expansion memory module 200 may include the SPD apparatus 170 or 270 that provides SPD data.

Referring to FIG. 10A, a memory system 10a may include a base memory module 101 and an expansion memory module 201. An SPD apparatus 170a of the base memory module 101 may transmit information regarding the base memory module 101, that is, the SPD data to a memory controller via at least one of the module terminals 120. Furthermore, an SPD apparatus 270a of the expansion memory module 201 may transmit information regarding the expansion memory module 201, that is, SPD data to the SPD apparatus 170a of the base memory module 101 via the connector 280 of the expansion memory module 201 and the connector 180 of the base memory module 101.

According to an embodiment, if the base memory module 101 is used alone, the SPD apparatus 170a of the base memory module 101 may provide SPD data regarding the base memory module 101 to a memory controller (e.g., the memory controller 500 as illustrated in FIG. 1). Alternatively, if the expansion memory module 201 is attached to the base memory module 101, the base memory module 101 may provide SPD data regarding the memory system 10a including the expansion memory module 201 and the base memory module 101 to a memory controller (e.g., the memory controller 500 as illustrated in FIG. 1) via at least one of the module terminals 120, based on SPD data regarding the expansion memory module 201 received from the SPD apparatus 270a of the expansion memory module 201.

Referring to FIG. 10B, a memory system 10b may include a base memory module 102 and an expansion memory module 202. An SPD apparatus 170b of the base memory module 102 may transmit information regarding the base memory module 102, that is, SPD data to a memory controller. Furthermore, an SPD apparatus 270b of the expansion memory module 202 may transmit information regarding the expansion memory module 202, that is, SPD data to a memory controller via at least one of the connector 280 of the expansion memory module 202, the connector 180 of the base memory module 102, and the module terminals 120.

According to an exemplary embodiment, SPD data regarding the expansion memory module 202 may be directly provided to a memory controller via at least one of the module terminals 120. Therefore, the memory controller may control the memory system 10b based on the SPD data regarding the base memory module 102 provided by the SPD apparatus 170b of the base memory module 102 and SPD data regarding the expansion memory module 202 provided by the SPD apparatus 270b of the expansion memory module 202.

Figure 11:
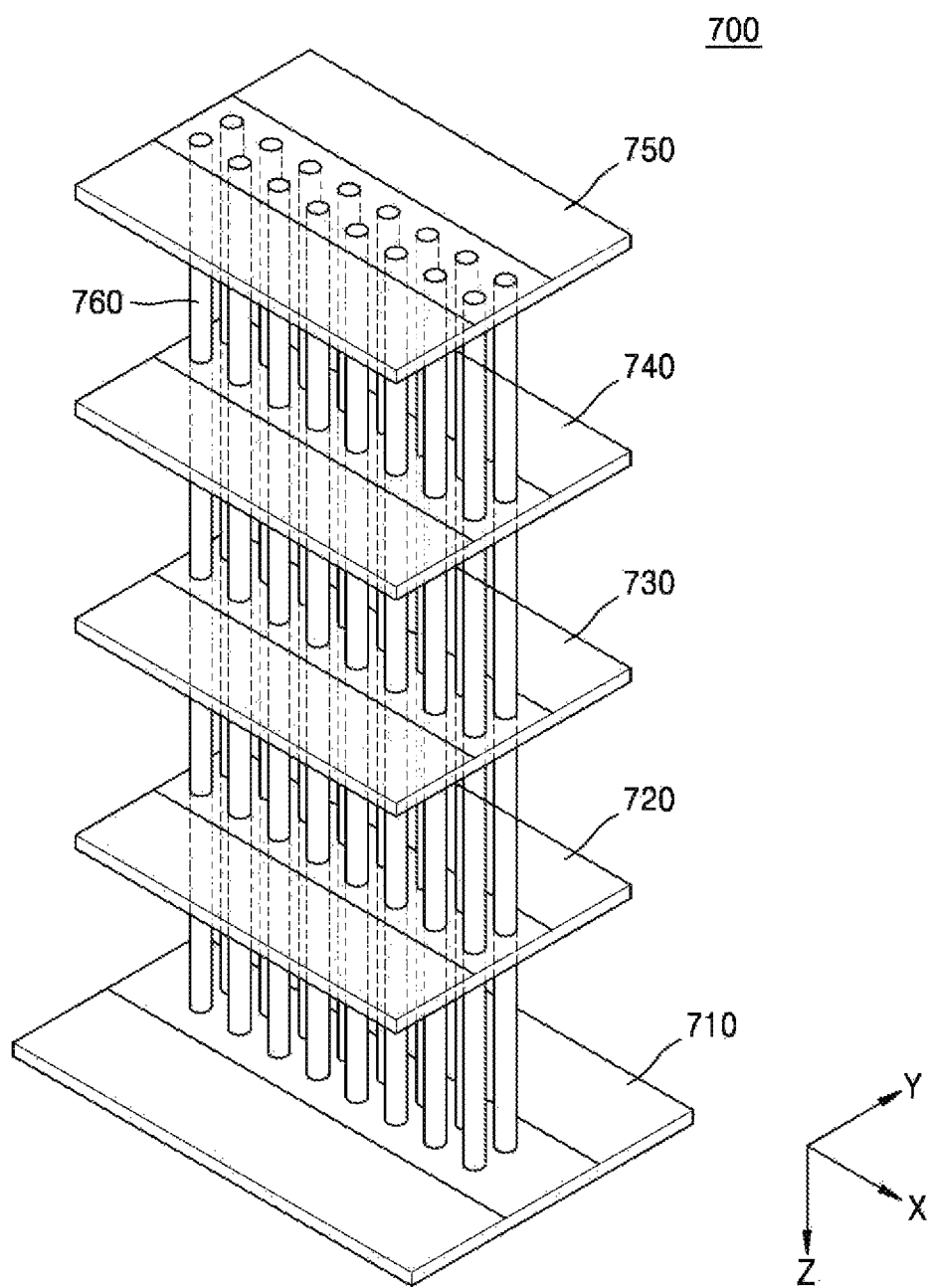
FIG. 11 is a diagram showing an example of an integrated circuit included in the memory package of FIG. 2, according to an exemplary embodiment.

FIG. 11 is a diagram showing an example of an integrated circuit 700 included in the memory package 130 of FIG. 2, according to an exemplary embodiment. According to this exemplary embodiment, the memory package 130 may include the integrated circuit 700 having a plurality of stacked semiconductor chips. The integrated circuit 700 may include an interface chip 710 and a plurality of memory chips 720 through 750.

The memory device 138 of FIG. 3 may include a plurality of memory chips 720, 730, 740, and 750, where each of the memory chips 720, 730, 740, and 750 may include a memory cell array consisting of a plurality of memory cells for storing data. Pad areas of the plurality of memory chips 720, 730, 740, and 750 may be connected to each other via a TSV 760. The TSV 760 may be connected to the interface chip 710. The interface chip 710 may include the buffer 137 of FIG. 3 and may be connected to the first package terminals 131 and the second package terminals 132.

Figure 12:
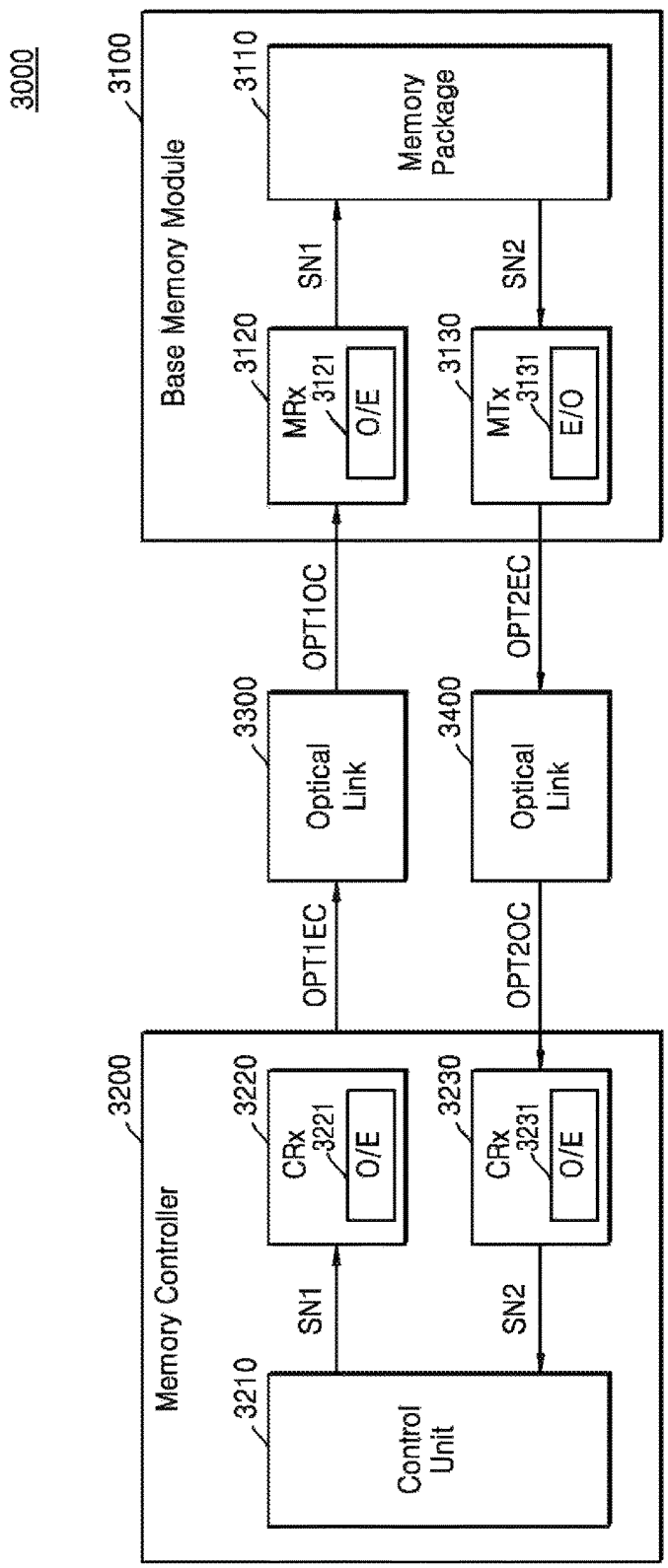
FIG. 12 is a block diagram showing a computing system including a base memory module and a memory controller, according to an exemplary embodiment.

FIG. 12 is a block diagram showing a computing system 3000 including a base memory module 3100 and a memory controller 3200, according to an embodiment. As shown in FIG. 12, according to an exemplary embodiment, the base memory module 3100 and the memory controller 3200 may communicate with each other by transmitting and receiving optical signals. Referring to FIG. 12, the computing system 3000 may include the base memory module 3100, the memory controller 3200, and optical connecting devices 3300 and 3400, where the optical connecting devices 3300 and 3400 may connect the base memory module 3100 and the memory controller 3200 to each other.

The memory controller 3200 may include a control unit (e.g., a control circuit or a logic circuit) 3210, a first transmitter 3220, and a first receiver 3230. The control unit 3210 may transmit a first electric signal SN to the first transmitter 3220. The first electric signal SN may include a command/address signal, a clock signal, and a chip selecting signal transmitted to the base memory module 3100, for example.

The first transmitter 3220 may include a first light modulator 3221, and the first light modulator 3221 may transform the first electric signal SN to a first optical transmission signal OPT1EC and transmit the first optical transmission signal OPT1EC to the optical connecting device 3300. The first optical transmission signal OPT1EC may be transmitted via the optical connecting device 3300 in a serial communication. The first receiver 3230 may include a first light demodulator 3231, where the first light demodulator 3231 may transform a second optical reception signal OPT2OC received from the optical connecting device 3400 to a second electric signal SN2 and transmit the second electric signal SN2 to the control unit 3210. The second electric signal SN2 may include a data signal and SPD data. The control unit 3210 may control an operation for writing data to the base memory module 3100 or an operation for reading out data from the base memory module 3100.

The base memory module 3100 may include a memory package 3110, a second receiver 3120, and a second transmitter 3130. The second receiver 3120 may include a second light demodulator 3121, where the second light demodulator 3121 may transform a first optical reception signal OPT1OC received from the optical connecting device 3300 to the first electric signal SN and transmit the first electric signal SN to the memory package 3110.

At the memory package 3110, in response to the first electric signal SN, data may be written to a memory device included in the memory package 3110 or data read out from the memory device may be transmitted to the second transmitter 3130 as the second electric signal SN2. As described above, data may be input to or output from the memory device included in the memory package 3110 via a buffer included in the memory package 3110. For example, if the base memory module 3100 is used alone, the buffer may be deactivated, and the buffer may bypass data. Alternatively, if an expansion memory module (e.g., the expansion memory module 200 of FIG. 2) is attached to the base memory module 3100, the buffer may be activated and temporarily store data.

The second transmitter 3130 may include a second light modulator 3131, where the second light modulator 3131 may transform the second electric signal SN2 to a second optical data signal OPT2EC and transmit the second optical data signal OPT2EC to the optical connecting device 3400. The second optical data signal OPT2EC may be transmitted via the optical connecting device 3400 in a serial communication.

Figure 13:
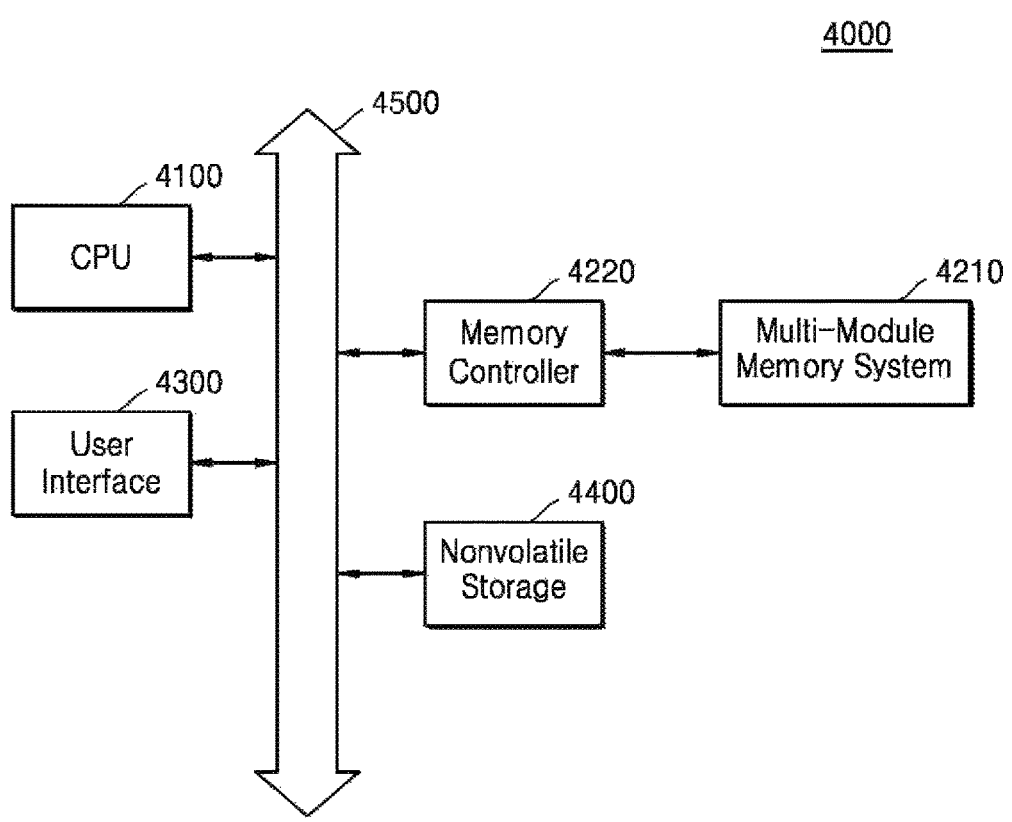
FIG. 13 is a block diagram showing a computing system according to an exemplary embodiment.

FIG. 13 is a block diagram showing a computing system 4000 according to an embodiment. As shown in FIG. 13, the computing system 4000 may include a central processing unit (CPU) 4100, a multi-module memory system 4210, a memory controller 4220, a user interface 4300, and a non-volatile storage apparatus 4400. The CPU 4100, the memory controller 4220, the user interface 4300, and the non-volatile storage apparatus 4400 may communicate with one another via a bus 4500. Although not shown in FIG. 13, the computing system 4000 may further include ports for communicating with a video card, a sound card, a memory card, an USB apparatus, or other electronic apparatuses. The computing system 4000 may be embodied as a personal computer or a mobile electronic apparatus, such as a laptop computer, a mobile phone, a personal digital assistant (PDA), and a camera.

The CPU 4100 may perform certain calculations or tasks. According to an exemplary embodiment, the CPU 4100 may be a microprocessor or a graphics processing unit (GPU). The CPU 4100 may communicate with the memory controller 4220, the user interface 4300, and the non-volatile storage apparatus 4400 via the bus 4500. The CPU 4100 may also be connected to an expansion bus, such as a peripheral component interconnect (PCI) bus.

The memory controller 4220 may provide an interface for accessing the multi-module memory system 4210 to the other components of the computing system 4000. For example, the multi-module memory system 4210 may function as a data memory for the CPU 4100, and the memory controller 4220 may support direct memory access (DMA) for storing data received from the bus 4500 or transmit stored data to the bus 4500. The multi-module memory system 4210 may include a base memory module and an expansion memory module according to an embodiment. For example, the multi-module memory system 4210 may communicate with the memory controller 4220 via a single slot, and the expansion memory module may communicate with the memory controller 4220 via the base memory module.

The user interface 4300 may include an input unit, such as a keyboard, a keypad, and a mouse, for receiving an input signal from a user and may include an output unit, such as a printer or a display apparatus, for providing an output signal to the user.

The non-volatile storage apparatus 4400 may include a non-volatile memory device, such as an EEPROM, a flash memory, a phase change random access memory (PRAM), a resistance random access memory (RRAM), a nano floating gate memory (NFGM), a polymer random access memory (PoRAM), a magnetic random access memory (MRAM), and a ferroelectric random access memory (FRAM) or may include a magnetic disk.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A base memory module, to/from which an expansion memory module is attached/detached, the base memory module comprising:
   a module board;
   a plurality of module terminals arranged on the module board to be connected to a slot; and a plurality of memory packages, each comprising a first surface to be attached to the module board and a second surface opposite to the first surface facing away from the module board, wherein each of the plurality of memory packages comprises a plurality of package terminals exposed on the second surface of the memory package configured to be connected to the expansion memory module.

2. The base memory module of claim 1, wherein each of the plurality of memory packages further comprises:
a memory device; and
a buffer connected to the memory device and at least one of the plurality of module terminals, and
at least one of the plurality of package terminals is electrically connected to the buffer.

3. The base memory module of claim 1, wherein the module board comprises a first surface and a second surface opposite to the first surface,
some of the plurality of memory packages are configured to be attached onto the first surface of the module board, and
the remaining of the plurality of memory packages are configured to be attached onto the second surface of the module board.

4. The base memory module of claim 1, wherein each of the package terminals is a pin, a pad, a ball, or a bump.

5. The base memory module of claim 2, wherein each of the plurality of memory packages comprises first and second substrates arranged parallel to each other, wherein the first substrate is arranged adjacent to the first surface of the memory package and the second substrate is arranged adjacent to the second surface of the memory package, and
the buffer is electrically connected to at least one of the plurality of package terminals via a pattern formed at the first substrate and is electrically connected to at least one of the plurality of module terminals via a pattern formed at the second substrate.

6. The base memory module of claim 1, further comprising at least one cover detachably attached to the second surfaces of the plurality of memory packages and comprising an insulator.

7. The base memory module of claim 1, further comprising at least one attachment element configured to attach the expansion memory module to the base memory module.

8. The base memory module of claim 7, wherein the attachment element comprises a conductor and is electrically connected to a power node of the base memory module.

9. The base memory module of claim 1, wherein at least one of the plurality of package terminals is electrically connected to a power node of the base memory module.

10. The base memory module of claim 2, wherein the buffer is activated when the expansion memory module is attached to the base memory module.

11. The base memory module of claim 1, further comprising a connector arranged on the module board configured to be connected to the expansion memory module,
wherein serial presence detect (SPD) data of the expansion memory module is received from the expansion memory module by the base memory module via the connector.

12. An expansion memory module configured to be attached to and detached from a base memory module attached to a slot and comprising:
a module board having a first surface facing the base memory module and a second surface opposite to the first surface facing away from the base memory module when the expansion memory module is attached to the base memory module;
a plurality of expansion memory packages attached onto the second surface of the module board; and
a plurality of conductive connecting elements arranged on the first surface of the module board configured to be connected to a plurality of terminals arranged on a base memory package of the base memory module,
wherein each of the expansion memory packages is configured to be electrically connected to at least one of the plurality of conductive connecting elements.

13. The expansion memory module of claim 12, wherein each of the plurality of conductive connecting elements comprises a ball socket, a spring, or a conductive rubber.

14. The expansion memory module of claim 12, further comprising at least one attachment element configured to attach the expansion memory module to the base memory module.

15. The expansion memory module of claim 12, further comprising:
a connector arranged on the module board configured to be connected to the base memory module; and
a serial presence detect (SPD) apparatus attached to the module board and configured to provide SPD data of the expansion memory module,
wherein the SPD apparatus is configured to be electrically connected to the base memory module via the connector.

16. An electronic device comprising:
an expandable base module board;
a plurality of base module terminals arranged on the expandable base module board for connecting to a slot of a system board; and
a plurality of base memory packages, each of which includes a first surface facing the expandable base module board and a second surface opposite to the first surface facing away from the expandable base module board,
wherein each of the plurality of base memory packages comprises a plurality of base package terminals exposed on the second surface of the base memory package configured to be connected to an expansion memory module.

17. The electronic device of claim 16, further comprising:
an expansion module board having a first surface for facing the expandable base module board and a second surface opposite to the first surface and for facing away from the expandable base module board when the expansion memory module is attached to the expandable base module board;
a plurality of expansion memory packages attached onto the second surface of the expansion module board; and
a plurality of conductive connecting elements arranged on the first surface of the expansion module board configured to be connected to the corresponding plurality of base package terminals arranged on each of the plurality of base memory packages,
wherein each of the expansion memory packages is configured to be electrically connected to at least one of the plurality of conductive connecting elements.

18. The electronic device of claim 17, wherein each of the plurality of expansion memory packages includes a memory device configured to exchange data with a memory controller via a buffer of one of the base memory packages when the buffer is activated.

19. The electronic device of claim 16, wherein each of the plurality of base memory packages comprises a buffer, and wherein the buffer for each base memory package is configured to be activated when an expansion memory module is attached to the expandable base module board and is configured to be deactivated when an expansion memory module is not attached to the expandable base module board.

20. The electronic device of claim 19, further comprising:
a system board including a slot configured to receive the expandable base module board,
wherein the buffer for each base memory package is configured to receive an enable signal, and
wherein a memory controller included on the system board is configured to activate the enable signal when an expansion memory module is attached to the expandable base module board and is configured to deactivate the enable signal when an expansion memory module is not attached to the expandable base module board.

* * * * *